US006583655B2

(12) United States Patent
Takahashi et al.

(10) Patent No.: US 6,583,655 B2
(45) Date of Patent: Jun. 24, 2003

(54) CLOCK CONTROL CIRCUIT

(75) Inventors: Miki Takahashi, Tokyo (JP); Hiraku Takahashi, Tokyo (JP); Takanori Saeki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/146,827

(22) Filed: May 16, 2002

(65) Prior Publication Data

US 2003/0038659 A1 Feb. 27, 2003

(30) Foreign Application Priority Data

May 24, 2001 (JP) .......................... 2001-154932

(51) Int. Cl.[7] .............................................. H03L 7/00
(52) U.S. Cl. ...................................... 327/160; 327/151
(58) Field of Search ................................. 327/295, 298, 327/141, 144, 146, 150, 151, 156, 159, 160

(56) References Cited

U.S. PATENT DOCUMENTS

| 5,485,490 A | * | 1/1996 | Leung et al. ............... 375/371 |
| 6,002,279 A | * | 12/1999 | Evans et al. ............... 327/144 |
| 6,125,157 A | * | 9/2000 | Donnelly et al. .......... 375/371 |
| 6,380,774 B2 | * | 4/2002 | Saeki ........................ 327/119 |
| 6,435,737 B1 | * | 8/2002 | Wise et al. ................. 712/200 |
| 6,466,098 B2 | * | 10/2002 | Pickering .................... 331/25 |

FOREIGN PATENT DOCUMENTS

JP        2001-273048        10/2001

OTHER PUBLICATIONS

Horowitz M. et al., "PLL Design for a 500 MB/s Interface", *ISSCC* 160:161 (1993).
Sidiropoulos S. et al., "A Semi–Digital DLL with Unlimited Phase Shift Capability and 0.08–400MHz Operating Range", *ISSCC* 332–333 (1997).

* cited by examiner

Primary Examiner—Timothy P. Callahan
Assistant Examiner—Cassandra Cox
(74) Attorney, Agent, or Firm—Scully, Scott, Murphy & Presser

(57) ABSTRACT

A clock control circuit includes a ring counter for outputting a signal of N bits count value and a complementary signal thereof; a rescue & flag generating circuit for effecting rescue from a bit pattern that is outside of expectations and generating a flag signal JBTFLG having a value corresponding to a combination of bits in a 2N-bit signal; a decoder; a clock selector for outputting a pair of clocks from multiphase clocks based upon a selection control signal from the decoder circuit; an interpolator for outputting a signal having a delay time corresponding to a time that is the result of internally dividing the phase difference between the pair of clocks; a phase comparator for comparing the phase of the interpolator output and the phase of a reference clock; and an interpolator control circuit, the shift direction of which varies, for outputting an interior-division ratio control signal that sets the interior-division ratio of the interpolator based upon the phase comparison by the phase comparator and the flag signal.

22 Claims, 16 Drawing Sheets

FIG. 4

| RING COUNTER VALUE | | DECODE | CLOCK SELECTION CONTROL SIGNAL | FLAG |
|---|---|---|---|---|
| FF1,2,3 | FF1,2,3(INVERTED) | | S0~S5 | JTBFLG |
| 000 | 111 | ↑ | 000110 | 1 |
| 100 | 011 | ↑ | 000011 | 0 |
| 110 | 001 | ↑ | 100001 | 1 |
| 111 | 000 | ↑ | 110000 | 0 |
| 011 | 100 | ↑ | 011000 | 1 |
| 001 | 110 | ↑ | 001100 | 0 |
| 000 | 111 | ↑ | 000110 | 1 |
| <OUTSIDE EXPECTATIONS> | | | | |
| 010→000 | 101→111 | | 000110 | |
| 101→111 | 010→000 | | 110000 | |

*COUNTER VALUE IS RESULT OF COUNTING BY DOWN SIGNAL IN UP-DOWN DIRECTION
(IN CASE OF UP-COUNT, COUNTER VALUE IS RESULT OF COUNTING IN DOWN-UP DIRECTION)

000000 ←MULTIPHASE CLOCK CHANGEOVER

000001

000011

000111  | LEFT SHIFT OF CONTROL SIGNAL C |

001111

011111

111111 ←MULTIPHASE CLOCK CHANGEOVER

011111

001111

000111  | RIGHT SHIFT OF CONTROL SIGNAL C |

000011

000001

000000 ←MULTIPHASE CLOCK CHANGEOVER

000001

000011

000111

CLOCK CONTROL CIRCUIT

FIELD OF THE INVENTION

This invention relates to a clock control circuit and, more particularly, to a clock control circuit that employs an interpolator.

BACKGROUND OF THE INVENTION

A PLL (Phase-Locked Loop) or a DLL (Delay-Locked Loop) is used as a clock control circuit for supplying a clock to a sequential circuit or circuit block driven by a clock. In addition, a combination of a PLL, DLL and interpolator also is known in the art.

Several examples of clock control techniques using interpolators will now be described. The generation of multiphase clocks P0 to Pn using a PLL circuit is described in Reference 1 (ISSC 1993 pp. 160–161, Mark Horowitz et al., "PLL Design for a 500 MB/s Interface"). In an arrangement described in Reference 1, as shown in FIG. 16, a PLL 1510 outputs multiphase clock signals P0 to Pn synchronized to an input clock 1. The multiphase clock signals P0 to Pn are fed to a switch 1520. Two mutually adjacent signals (of even and odd phases) selected by the switch 1520 are provided to an interpolator (a phase interpolator) 1530, which produces an output signal OUT obtained by internally dividing the phase difference between these two input signals. The switch 1520 that selects the pair of signals provided to the interpolator 1530 comprises an even-phase selector, a shift register for supplying a selection control signal to the even-phase selector, an odd-phase selector and a shift register for supplying a selection control signal to the odd-phase selector.

In the arrangement described in Reference 1, the interpolator 1530 has an analog structure comprising a differential circuit that receives two inputs. A control circuit 1540 has an FSM (Finite State Machine) circuit for monitoring phase to determine which of the two inputs is earlier in phase and for outputting a count signal to an up/down counter (not shown), and a DA converter (not shown) for converting the output of the up/down counter to an analog signal. The DA converter supplies the interpolator 1530 with a current corresponding to the even/odd phase. The PLL 1520 comprises a phase comparator circuit, a loop filter, a voltage-controlled oscillator (VCO) to which the voltage of the loop filter is input as the control voltage, and a frequency divider for frequency dividing the output of the voltage-controlled oscillator and feeding the resultant signal back to an input of the phase comparator circuit.

Further, Reference 2 (ISSCC 1997 pp. 332–333, S. Sidiropoulos and Mark Horowitz et al., "A semi-digital delay locked loop with unlimited phase shift capability and 0.08–400 MHz operating range") describes an arrangement in which a DLL (Delay-Locked Loop) circuit is used instead of the PLL circuit of FIG. 16. Here a DLL outputs multiphase clock signals P0 to Pn synchronized to the input clock. The multiphase clock signals P0 to Pn are input to the selector (switch) 1520. Two mutually adjacent signals enter the interpolator 1520, which delivers the output signal OUT obtained by internally dividing the phase difference between these two signals. On the basis of the result of detecting a phase difference between the output OUT and a reference clock, the control circuit 1540 conducts control to vary the interior-division ratio of the interpolator 1530 and controls the switching of the selector 1520. The interpolator also is implemented by analog circuits.

In order to provide a clock control circuit that reduces phase error to a major degree by eliminating center-frequency fluctuation, which is caused when a PLL or the like is used, and jitter that is ascribable to a feedback loop, the Applicant has proposed a clock control circuit, which is described in the specification of Japanese Patent Application No. 2000-083579, that uses a frequency multiplying interpolator as multiphase clock generating circuit for generating the multiphase clock signals P0 to Pn.

Reference will be had to FIG. 14 to give an overview of this clock control circuit, which uses an interpolator, proposed in Japanese Patent Application No. 2000-083579 (still undisclosed at the time of filing of this application). Clock signals P0 to Pn generated using a frequency multiplying interpolator as a multiphase clock generating circuit 210 are adjusted to any phase by a clock selector 170 and a fine adjusting interpolator 130. As described in the specification of Japanese Patent Application No. 2000-083579, the frequency multiplying interpolator includes a frequency divider for frequency dividing an input clock to thereby generate and output multiphase clocks; a cycle sensing circuit for sensing the cycle of the input clock, and a multiphase-clock frequency multiplying circuit, which has the multiphase clocks output by the frequency divider input thereto, for generating multiphase clocks obtained by frequency multiplying these multiphase clocks. The multiphase-clock frequency multiplying circuit has a plurality of timing-difference dividing circuits each for outputting a signal obtained by dividing a timing difference between two inputs applied thereto, and a plurality of multiplexing circuits each for multiplexing and outputting output signals from two timing-difference dividing circuits. Each of the plurality of timing-difference dividing circuits has a timing-difference dividing circuit (interpolator) to which two identical-phase clocks are applied as inputs and a timing-difference dividing circuit to which two clocks of mutually adjacent phases are applied as inputs. In the present invention, the multiphase clock generating circuit 210 is not limited to a frequency multiplying interpolator; any suitable arrangement may be used. A detailed description of the frequency multiplying interpolator proposed by the aforesaid Japanese Patent Application No. 2000-083579 is not included in the specification of this application.

On the basis of a control signal S (referred to as a "clock selection signal") output from the control circuit 200, the clock selector 170 selects mutually adjacent odd- and even-phase signals as a signal pair from the multiphase clock signals P0 to Pn output by the multiphase clock generating circuit 210, and supplies these signals to the interpolator 130.

On the basis of a control signal C and its complementary signal CB output from the control circuit 200, the interpolator 130 outputs a signal of a propagation delay tpd, which is defined by a time obtained by internally dividing the phase difference (timing difference) between two input signals applied thereto.

The control circuit 200 has a shift register (not shown) as a circuit for supplying the interior-division ratio control signal C/CB to the interpolator 130. Upon receiving an output signal (the result of a phase comparison) from a phase comparator that compares the phase of a reference clock (not shown) and the phase of the output clock from the interpolator 130, the control circuit 200 outputs the interior-division ratio control signal C/CB, which is for varying the timing-difference division value (interior-division ratio) of the timing difference between the two inputs to the interpolator 130, in order to compensate for phase lead/lag in accordance with the degree of phase lead/lag of the output of interpolator 130 with respect to the reference clock. An arrangement may be adopted in which the control signal CB, which is the complement of the interior-division ratio control signal C, is not generated in the control circuit 200. Rather, a signal obtained by inverting each control signal C, which is output from the control circuit 200, by an inverter, may be supplied to the interpolator 130 as the signal CB.

Further, the control circuit 200 has a counter and a decoder (neither of which are shown) as the circuit for supplying the clock selection control signal S to the clock selector 170. If, when it is detected that the setting of the interior-division ratio of the interpolator 130 has reached an upper or lower limit (extremal point), it is necessary to adjust further the lead/lag of the output clock of interpolator 130 with respect to the reference clock, the set range of the interior-division ratio is switched over to a different range. In order to accomplish this, the control circuit 200 changes over the set value of the clock selection control signal S, which is output to the clock selector 170, in dependence upon phase lead or lag. The clock selector 170 responds to the clock selection control signal S, the value of which has been changed over, by changing over clock-pair combination output to the interpolator 130.

For example, assume that the clock selector 170 selects the set of clocks P1 and P2 from among the multiphase clocks P0 to Pn [where the phase difference between clocks is 360°/(n+1)], and that it is necessary to further advance the phase of the output signal of interpolator 130 from the phase difference between the output signal of interpolator 130 and the reference signal (reference clock). In such case the clock selector 170, upon receiving the clock selection control signal S from the control circuit 200, changes over the clock output, and supplies it to the interpolator 130, so as to internally divide the phase difference (timing difference) between, say, the clock signal P0, the phase of which is one advanced than that of the presently selected clock signal P1 (where P−1 is assumed to be Pn), and the original clock signal P1. On the other hand, in a case where it is necessary to regard further the phase of the output of interpolator 130, the clock selector 170, upon receiving the clock selection control signal S from the control circuit 200, changes over the clock signal pair, and supplies it to the interpolator 130, so as to internally divide the phase difference (timing difference) between the clock signal P3, the phase of which is one later than that of the presently selected clock signal P2 (where Pn+1 is assumed to be P0), and the original signal P2.

Let the suffix n of the multiphase clocks be 2m−1 (the number of phases of the multiphase clocks is 2m). The clock selector 170 includes a first selector (not shown) which, in response to the clock selection control signal S from the control circuit 200, selects one of the odd-phase clocks P0, P2, P4, ···, 2m−2, and a second selector (not shown) which, in response to the clock selection control signal S from the control circuit 2300, selects one of the even-phase clocks P1, P3, P5, ···, 2m−1. The control circuit 200 performs control to change over the clock output in such a manner that the combination of the odd-, even-phase clock output pair supplied to the interpolator 130 will be a clock pair of mutually adjacent odd- and even-phase clocks, e.g., (P0, P1), (P2, P1), (P2, P3) and so on.

SUMMARY OF THE DISCLOSURE

As mentioned above, the control circuit 200 in the clock control circuit of FIG. 14 includes a counter and a decoder circuit for supplying the clock selector 170 with the clock selection control signal S. If the number of phases of the multiphase clocks becomes too large, this will lead to an increase in the size of the decoder circuit. The Inventor has recognized that the decoder circuit, etc., needs to be specially contrived.

The inventor has recognized also that it is necessary to implement a control circuit that is reduced in size and that is resistance to error ascribable to noise and the like.

Accordingly, it is an object of the present invention to provide a clock control circuit the size of which is reduced.

The above and other objects of the invention are satisfied, at least by providing a clock control circuit, in accordance with one aspect of the present invention, which comprises:

a ring counter, in which counting direction changes over freely between up and down directions, for outputting 2N-number of N-bit signals and N-bit inverted signals, which are obtained by inverting each bit of the N-bit signals, as count values;

a decoder circuit, which receives a 2N-bit signal comprising the N-bit signal and the N-bit inverted signal output from the ring counter, for inverting one bit of the 2N-bit signal to thereby output a decoded signal in which at least two mutually adjacent bits among the 2N bits take on a first value and the other bits take on a second value, the 2Nth bit and the first bit at the ends of the 2N-bit signal being mutually adjacent;

a clock selector, which receives a plurality of clock signals of mutually shifted phases are input and which receives the decoded signal output from the decoder circuit as a clock selection control signal, for outputting a pair of clock signals selected from the plurality of clock signals;

an interpolator, which receives the pair of clock signals output from the clock selector from first and second input terminals, for outputting, from an output terminal, a clock signal having a delay time corresponding to a time obtained by internally dividing a phase difference between the pair of clock signals at an interior-division ratio set by an interior-division control signal input thereto; a phase comparator circuit for comparing phase of the clock signal, which is output from the interpolator, and phase of a reference clock; and an interpolator control circuit, which receives a phase-comparison result signal output from the phase comparator circuit, and which comprises a shift register the shift direction of which is varied based upon the phase-comparison result signal and a forward/reverse relationship of the phases of the clock signals input to the first and second input terminals of the interpolator, for supplying the interpolator with the interior-division control signal that sets the interior-division ratio of the interpolator.

In accordance with another aspect of the present invention, the interpolator control circuit has a circuit which, in a case where the interior-division ratio of the interpolator has attained an upper-limit value or a lower-limit value (referred to as an "extremal point"), places a flag signal, which is indicative of an extremal point, in an active state and outputs the active signal. The clock control circuit further includes a circuit for generating up and down signals, which are supplied to the ring counter, based upon the phase-comparison result signal from the phase comparator circuit when the flag signal output from the interpolator control circuit indicative of the extremal point is active.

In accordance with another aspect of the present invention, the ring counter is provided with N-number of flip-flops and N-number of logic circuits, Which correspond to respective ones of the N-number of flip-flops, for supplying input signals to respective ones of these flip-flops; each logic circuit having an up signal, a down signal and a hold signal specifying up, down and hold, respectively, and an output signal from each of the N-number of flip-flops input thereto; control being performed in such a manner that: in the case of an up-count, a signal that is the inverse of the output of the last flip-flop is fed back and input to the first flip-flop via the logic.circuit corresponding to the first flip-flop, the state of the output of the preceding flip-flop being transmitted to the input of the succeeding flip-flop via each logic circuit at the time of a shift operation by the clock; in the case of a down-count, a signal that is the inverse of the output of the first flip-flop is fed back and input to the last flip-flop via the logic circuit corresponding to the last flip-flop, the state of the output of the succeeding flip-flop being transmitted to the input of the preceding flip-flop via each logic circuit at the time of a shift operation by the clock; and in the case-of the hold state, the output signals of the flip-flops corresponding to the logic circuits are supplied to the inputs of the flip-flops corresponding to the logic circuits.

In the present invention, the decoder circuit is preferably composed by 2N-number of AND gates the inputs to which are an Ith bit and an (I+1)th bit (where I is 1, 2, ~N, and 2N+1 becomes 1 when I is 2N) of a signal, which has a bit width of 2N, comprising the N-bit signal and the signal obtained by inverting each bit of this N-bit signal.

In the present invention, the interpolator control circuit has a plurality of unit circuits each of which outputs an interior-division control signal that sets the interior-division ratio of the interpolator, the output of the unit circuit that is at one end of the plurality of unit circuits being transmitted as the output of the unit circuit at the other end in domino fashion.

More specifically, the interpolator control circuit has at least a plurality (M-number) of flip-flops; a control signal generating circuit for generating left-shift, right-shift and hold signals based upon the up signal and down signal output from the phase comparator circuit and the value of the flag signal output from the flag generating circuit; and M-number of control logic circuits; wherein (M−2)-number of the control logic circuits exclusive of the first and Mth thereof at both ends have, as inputs thereto, the left-shift, right-shift and hold signals output from the control signal generating circuit, an output signal corresponding to each control logic circuit from among the M-bit output signals, and two output signals neighboring this output signal, for deciding, and supplying to a data input terminal of the corresponding flip-flop, an output logic value in accordance with the value of each output signal input thereto and the shift direction; the first and M-th control logic circuits have, as inputs thereto, the left-shift, right-shift and hold signals output from the control signal generating circuit, output signals corresponding to respective ones of the control logic circuits at the ends, one output signal neighboring this output signal, and a fixed potential, for deciding, and supplying to a data input terminal of the corresponding flip-flop, an output logic value in accordance with these output signals and the shift direction; an output of each flip-flop exclusive of the first flip-flop is provided with an OR gate; and each OR gate, which receives the output signal of the flip-flop preceding the corresponding flip-flop and the output signal of the corresponding flip-flop, for delivering; as the interior-division control signal, the output signal of the first flip-flop and the output signals of the OR gates corresponding to the flip-flops from the second onward.

In the present invention, the interpolator includes a logic circuit, which has at least first and second input terminals and one output terminal, for outputting result of a predetermined logical operation between first and second input signals that enter from the first and second input terminals; a first switch element, connected between a first power supply and an internal node, having a control terminal for receiving the output signal of the logic circuit; and a buffer circuit, which has an input terminal connected to the internal node, for inverting an output logic value if the size relationship between potential at the internal node and a threshold value reverses; wherein a plurality of series circuits are connected in parallel between the internal node and a second power supply and each series circuit comprises a first constant-current source, a second switch element turned on and off by the first input signal, and a third switch element turned on and off by the interior-division control signal from the interpolator control circuit, and a plurality of series circuits are connected in parallel between the internal node and the second power supply and each series circuit comprises a second constant-current source, a fourth switch element turned on and off by the second input signal, and a fifth switch element turned on and off by the interior-division control signal from the interpolator control circuit.

In the present invention, the interpolator has a first switch element group and a second switch element group stacked one above the other between a high-potential power supply and an internal node, wherein the first switch element group, which is composed of parallel switch elements, has the input signal from the first input terminal or a signal that is the inverse of this input signal input commonly to control terminals thereof and the second switch element group, which is composed of parallel switch elements, has the interior-division ratio control signal input to respective ones of the control terminals thereof; a third switch element group and a fourth switch element group stacked one above the other between the internal node and a low-potential power supply, wherein the third switch element group, which is composed of parallel switch elements, has the interior-division ratio control signal input to respective ones of the control terminals thereof and the fourth switch element group, which is composed of parallel switch elements, has the input signal from the second input terminal or a signal that is the inverse of this input signal input commonly to control terminals thereof; a fifth switch element group and a sixth switch element group stacked one above the other between the high-potential power supply and the internal node, wherein the fifth switch element group, which is composed of parallel switch elements, has the input signal from the second input terminal or a signal that is the inverse of this input signal input commonly to control terminals thereof and the sixth switch element group, which is composed of parallel switch elements, has a complementary signal of the interior-division ratio control signal input to respective ones of the control terminals thereof; and a seventh switch. element group and an eighth switch element group stacked one above the other between the internal node and the low-potential power supply, wherein the seventh switch element group, which is composed of parallel switch elements, has a complementary signal of the interior-division ratio control, signal input to respective ones of the control terminals thereof and the eighth switch element group, which is composed of parallel switch elements, has the input signal from the second input terminal or a signal that is the inverse of this input signal input commonly to control terminals thereof; a capacitor is connected between the internal node and the low-potential power supply; and a buffer circuit is-provided and has an input terminal connected to the internal node for inverting the output logic value if the size relationship between the potential at the internal node and a threshold value reverses.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4 is a truth-value table for describing the operation of a decoder according to this embodiment;

FIG. 10 is a diagram illustrating an example of patterns of a control signal output from the interpolator control circuit according to this embodiment;

PREFERRED EMBODIMENTS OF THE INVENTION

Preferred embodiments of the invention will be described below.

Figure 1:
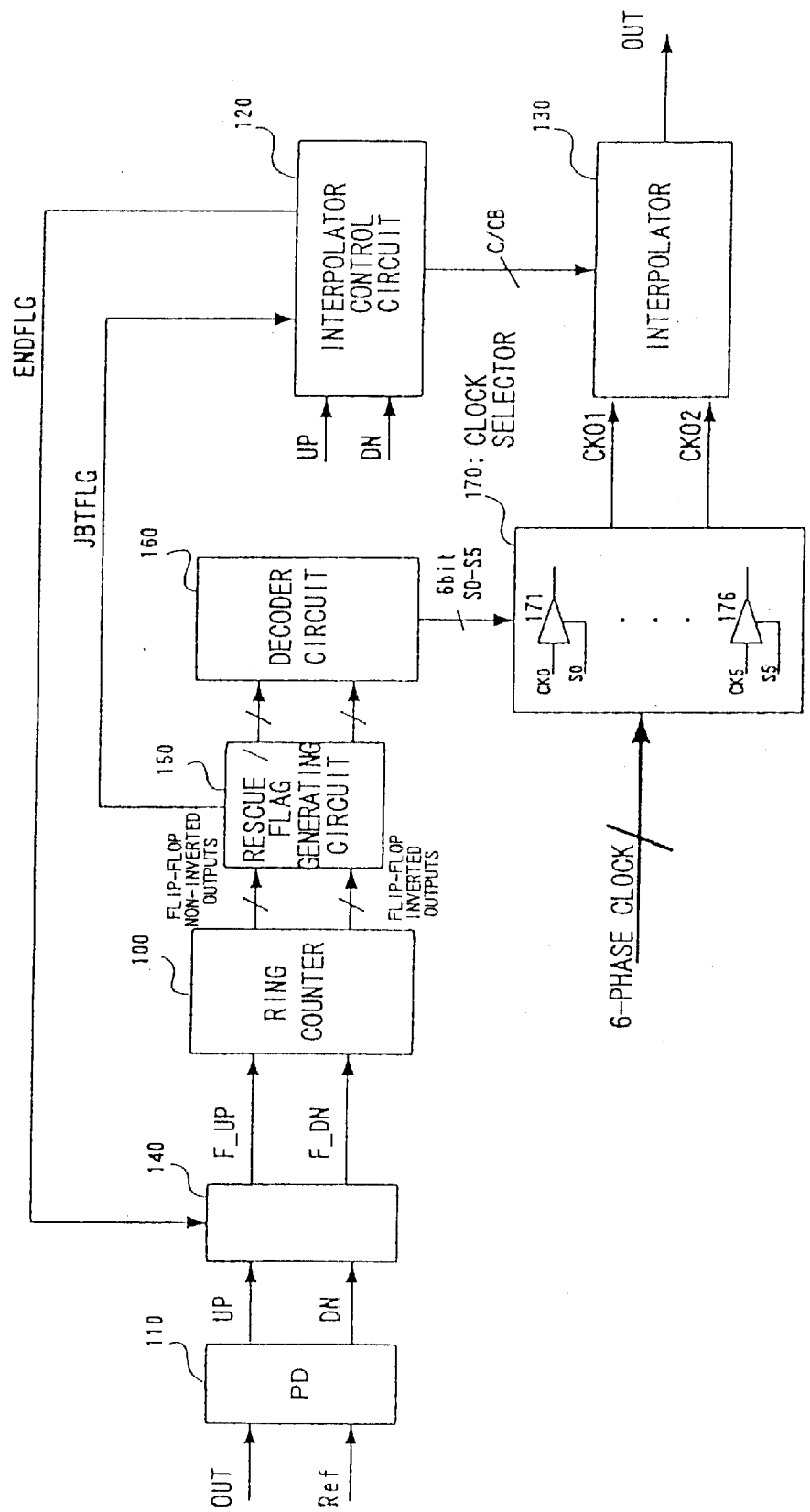
FIG. 1 is a block diagram illustrating the structure of a clock control circuit according to an embodiment of the present invention.

A clock control circuit in accordance with a preferred embodiment of the present invention, as shown in FIG. 1, comprises:

a ring counter (100 in FIG. 1), in which counting direction is changed over based upon an up signal and a down signal, for outputting an N-bit signal and an N-bit complementary signal obtained by inverting each bit of the N-bit signal;

a decoder circuit (160 in FIG. 1), which receives a 2N-bit output signal output from the ring counter (100 in FIG. 1), for inverting one bit of each of the 2N-number of input signals to thereby output a decoded signal in which at least two mutually adjacent bits among the 2N bits take on a first value and the other bits take on a second value, the 2Nth bit and the first bit at the ends of the 2N-bit signal being mutually adjacent;

a clock selector (170 in FIG. 1), which receives a plurality (2N-number) of clock signals of equally spaced phase differences as inputs and which receives the decoded signal output from the decoder circuit (160 in FIG. 1) as a clock selection signal S, for outputting a pair of clock signals selected by the clock selection signal S;

an interpolator (130 in FIG. 1), which receives the pair of clock signals output from the clock selector (170 in FIG. 1) from first and second input terminals, for outputting a clock signal having a delay time corresponding to a time obtained by internally dividing a phase difference between the pair of clock signals; and an interpolator control circuit (120 in FIG. 1), which comprises a shift register the shift direction of which is switched based upon a forward/reverse relationship of the phases of the clock signals input to the first and second input terminals of the interpolator (130 in FIG. 1), for setting the interior-division ratio of the interpolator (130 in FIG. 1).

Figure 7A:
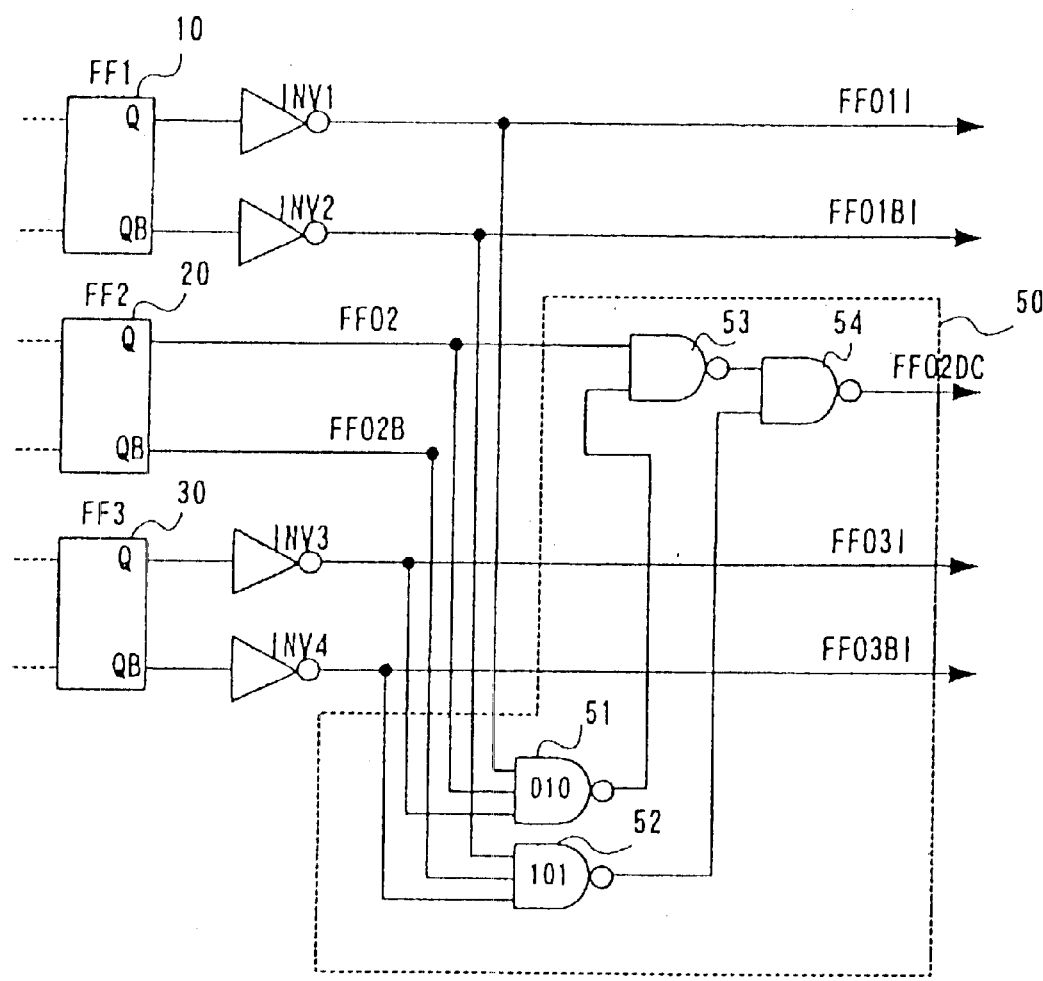
FIG. 7a is a diagram illustrating an example of the structure of a rescue circuit.

Preferably, in this embodiment of the present invention, the clock control circuit is provided with a rescue circuit [150 in FIG. 1; see FIG. 7a], which receives the output signal of 2N bits from the ring counter (100 in FIG. 1), for performing a comparison to determine whether the bit pattern is outside expectations.

When a bit patterns outside expectations is detected, the rescue circuit replaces this pattern with an allowed pattern and outputs the same. This enhances resistance to error.

Figure 7B:
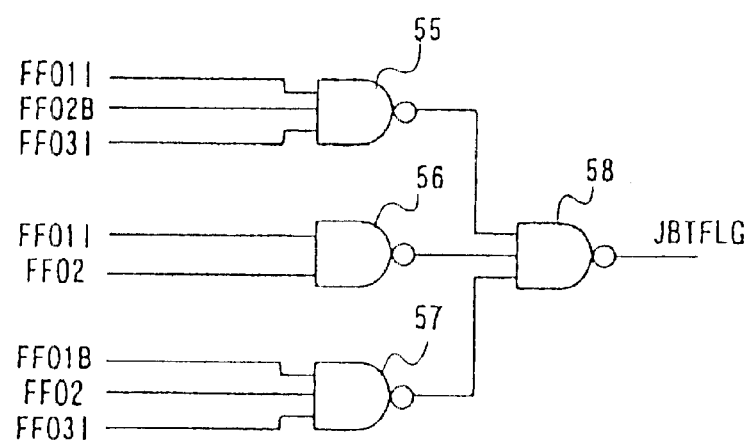
FIG. 7b is a diagram showing an example of the structure of a flag generating circuit.

Preferably, in this embodiment of the present invention, the clock control circuit is provided with a flag generating circuit [150 in FIG. 1; see FIG. 7b] for generating a flag signal (JBTFLG) that takes on a value corresponding to the bit pattern of the 2N-bit output signal of the ring counter (100 in FIG. 1). The flag signal (JBTFLG) is input to the interpolator control circuit (120 in FIG. 1) to notify of the forward/reverse relationship of the phase of the clock signals input to the first and second input terminals of the interpolator (130 in FIG. 1).

In the embodiment of the present invention, the ring counter (100 in FIG. 1) is provided with N-number of flip-flops (10, 20, 30 in FIG. 6) and N-number of logic circuits (11 to 14, 21 to 24, 31 to 34 in FIG. 6), which correspond to respective ones of the N-number of flip-flops, for supplying input signals to data input terminals of respective ones of these flip-flops. Each logic circuit (11 to 14, 21 to 24, 31 to 34 in FIG. 6) has an up signal (F_UP), a down signal (F_DN) and a hold signal (the output signal of a coincidence detection circuit 40 in FIG. 6) specifying up, down and hold, respectively, and an output signal from each of the N-number of flip-flops (10, 20 and 30.in FIG. 6) input thereto. In the case of an up-count, a signal that is the inverse of the output of the last flip-flop is fed back and input to the first flip-flop via the logic circuit corresponding to the first flip-flop, and the state of the output of the preceding flip-flop is transmitted to the input of the succeeding flip-flop via each logic circuit at the time of a shift operation by the clock. In the case of a down-count, a signal that is the inverse of the output of the first flip-flop is fed back and input to the last flip-flop via the logic circuit corresponding to the last flip-flop, and the state of the output of the succeeding flip-flop is transmitted to the input of the preceding flip-flop via each logic circuit at the time of a shift operation by the clock. In the case of the hold state, the output signals of the flip-flops corresponding to the logic circuits are supplied to the inputs of the flip-flops corresponding to the logic circuits.

In the embodiment of the present invention, the decoder circuit (160 in FIG. 1) is constituted by 2N-number of AND gates the inputs to which are an Ith bit and an (I+1)th bit (where I is 1, 2, ~N, and 2N+1 becomes 1 when I is 2N) of a signal, which has a bit width of 2N, comprising the N-bit signal and the signal obtained by inverting each bit of these N bits.

Figure 9:
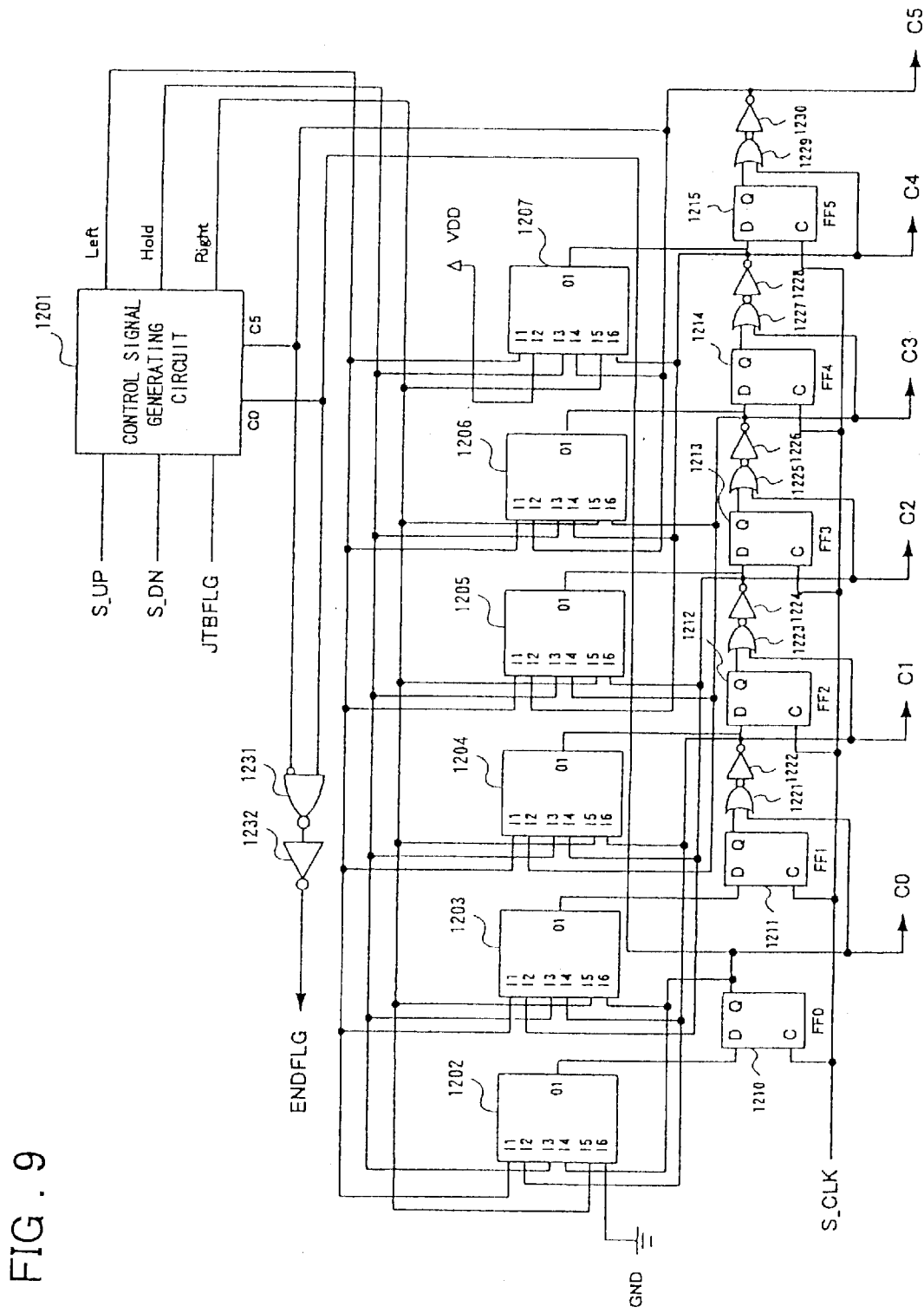
FIG. 9 is a diagram illustrating an example of the structure of an interpolator control circuit according to this embodiment.

In the embodiment of the present invention, the interpolator control circuit (120 in FIG. 1) has a plurality of unit circuits (flip-flops 1210 to 1215 and control logic circuits 1202 to 1207 in FIG. 9). The output of one of this plurality of unit circuits is transmitted as the output of the succeeding unit circuit in domino fashion. That is, the result of an OR operation between the signal transmitted from one unit circuit and the output of a flip-flop of the succeeding unit circuit is delivered as the output signal of the succeeding stage.

More specifically, the interpolator control circuit (120 in FIG. 1) has a plurality (M-number) of flip-flops; a control signal generating circuit (1201 in FIG. 9) for generating left-shift, right-shift and hold signals based upon the up signal and down signal output from a phase comparator circuit (110 in FIG. 1), which compares the output of the interpolator and a reference clock, and the value of the flag signal (JBTFLG) output from the rescue and flag generating circuit (150); and M-number of control logic circuits (1202 to 1207 in FIG. 9). (M−2)-number of the control logic circuits (1203 to 1206 in FIG. 9) from which the control logic circuits at both ends are excluded have, as inputs thereto, the left-shift, right-shift and hold signals, a corresponding output signal Ci, and output signals Ci−1, Ci+1 neighboring this output signal Ci, for deciding, and supplying to a data input terminal of the corresponding flip-flop, an output logic value in accordance with the shift direction. The control logic circuits (1202 and 1207 in FIG. 9) at the ends have, as inputs thereto, the left-shift, right-shift and hold signals, the corresponding output signal Ci, one output signal Ci−1 or Ci+1 neighboring this output signal, and a fixed potential, for deciding, and supplying to a data input terminal of the corresponding flip-flop, an output logic value in accordance with the shift direction. An output of each flip-flop exclusive of the first flip-flop is provided with an OR gate. Each OR gate, to which are input the output signal of the flip-flop preceding the corresponding flip-flop and the output signal of the corresponding flip-flop, for delivering, as the interior-division control signal, the output signal (C0) of the first flip-flop (1210 in FIG. 9) and the output signals (C1 to C5) of the OR gates corresponding to the flip-flops from the second onward.

In the embodiment of the present invention, the interpolator control circuit (120) has a circuit (1231, 1232 in FIG. 9) which, in a case where the interior-division ratio of the interpolator (130) has attained an upper-limit value or a lower-limit value (referred to as an "extremal point"), places a flag signal (ENDFLG), which is indicative of an extremal point, in an active state.

In the embodiment of the present invention, the clock control circuit further includes an up/down control circuit (140 in FIG. 1) for generating up and down signals, which are supplied to the ring counter (100 in FIG. 1), based upon the phase-comparison result signal from the phase comparator circuit (110 in FIG. 1) when the flag signal (ENDFLG) output from the interpolator control circuit (120) indicative of the extremal point is active.

Figure 13:
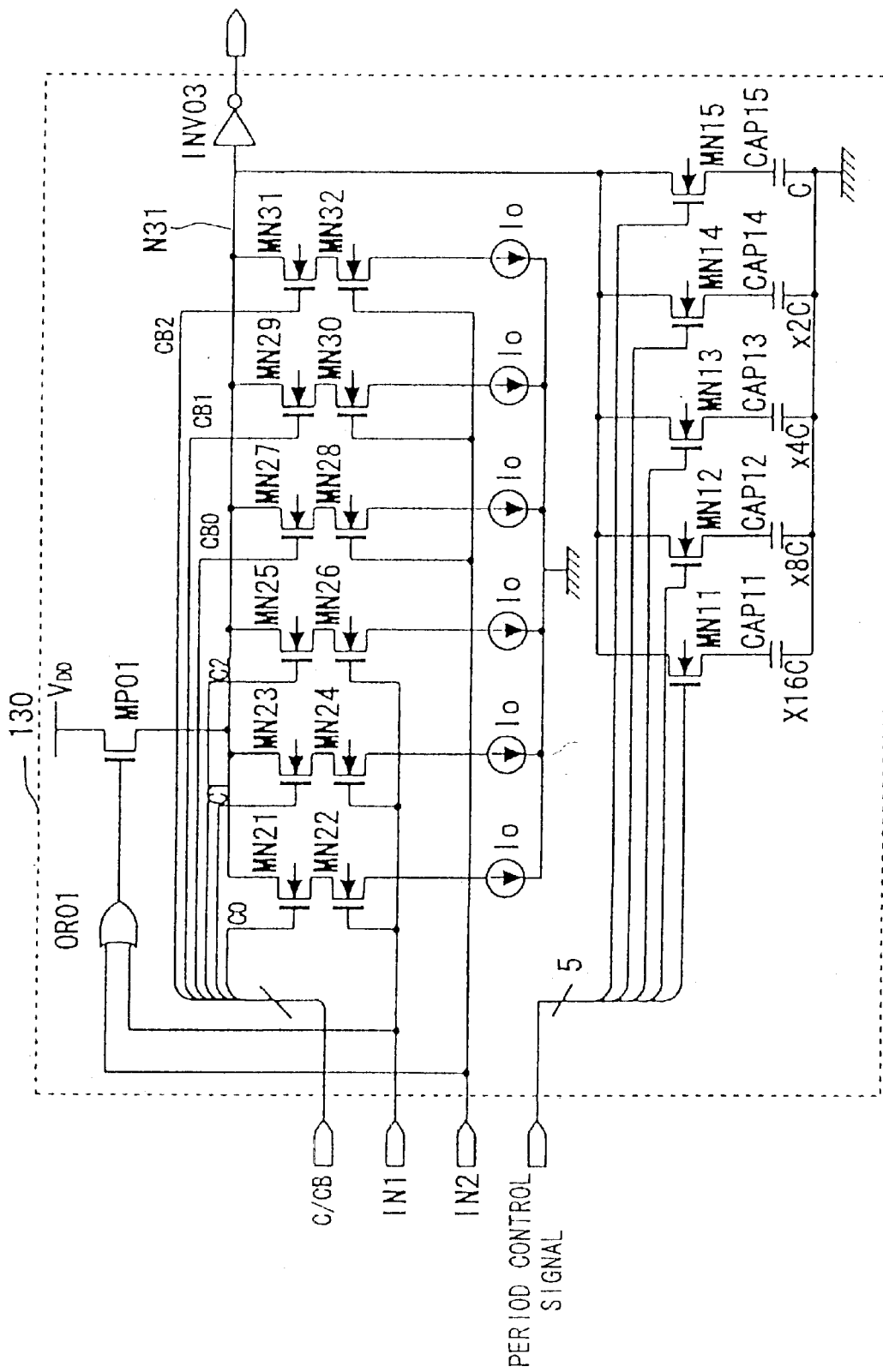
FIG. 13 is a diagram showing an example of the structure of an interpolator according to this embodiment.

In the embodiment of the present invention, the interpolator includes the following as an arrangement for internally dividing the timing difference (phase difference) with respect to a rising or falling edge, as shown in FIG. 13:

a logic circuit (OR 01) for outputting a result of a predetermined logic operation with regards to first and second input signals that are received from first and second input terminals;

a first switch element (MP0I), connected between a first power supply and an internal node (N31), having a control terminal for receiving the output signal of the logic circuit; and a buffer circuit (INV03), which has an input terminal connected to the internal node (N31), for inverting the output logic value if the size relationship between the potential at the internal node and a threshold value reverses.

A plurality of series circuits (switch elements MN22 and MN21, MN24 and MN23, MN26 and MN25, which are parallel-connected) are connected in parallel between the internal node (N31) and a second power supply and each series circuit comprises a first constant-current source, a second switch element turned on and off by the first input signal, and a third switch element turned on and off by the interior-division control signal from the interpolator control circuit, and a plurality of series circuits (switch elements MN28 and MN27, MN30 and MN29, MN32 and MN31, which are parallel-connected) are connected in parallel between the internal node and the second power supply and each series circuit comprises a second constant-current source, a fourth switch element turned on and off by the second input signal, and a fifth switch element turned on and off by the interior-division control signal from the interpolator control circuit.

Figure 15:
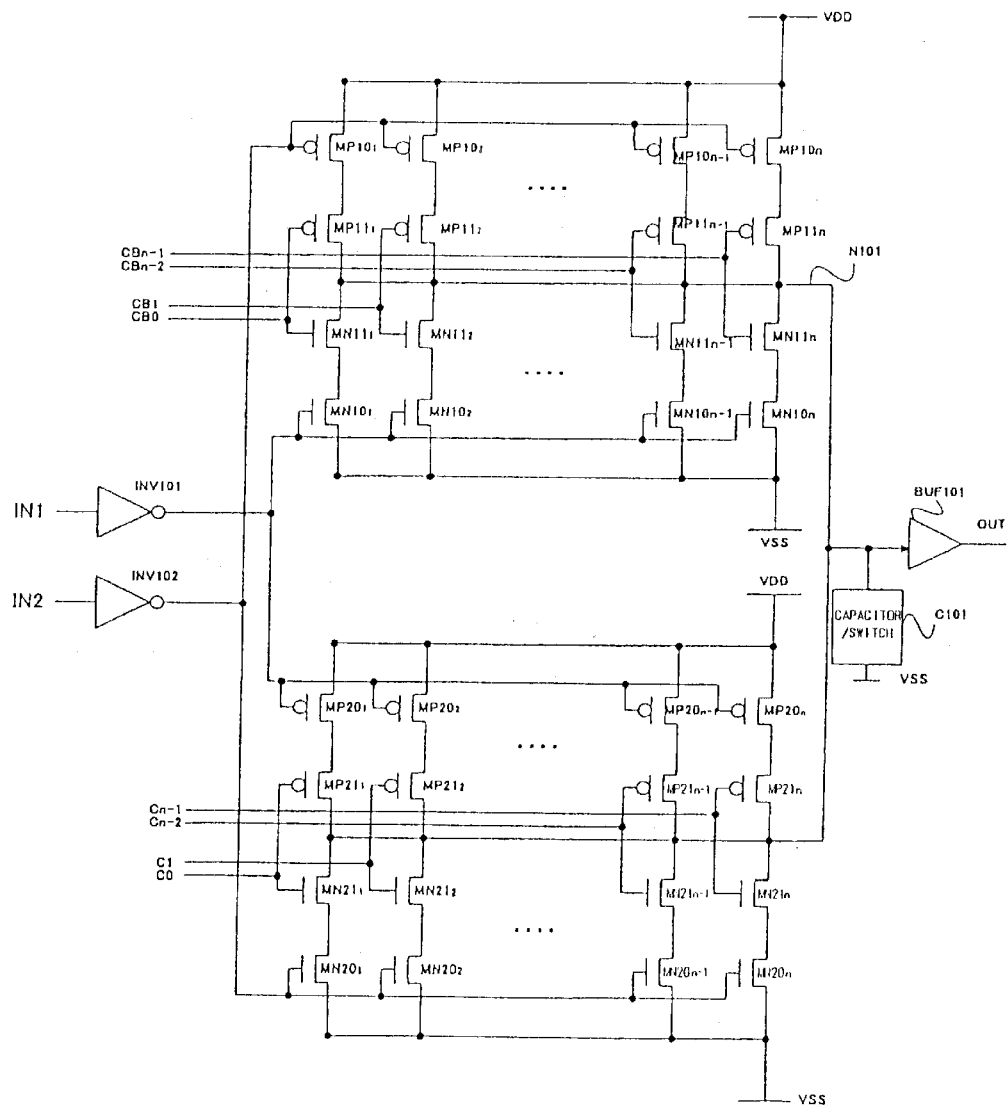
FIG. 15 is a diagram showing an example of the structure of an interpolator according to another embodiment of the present invention.
Figure 16:
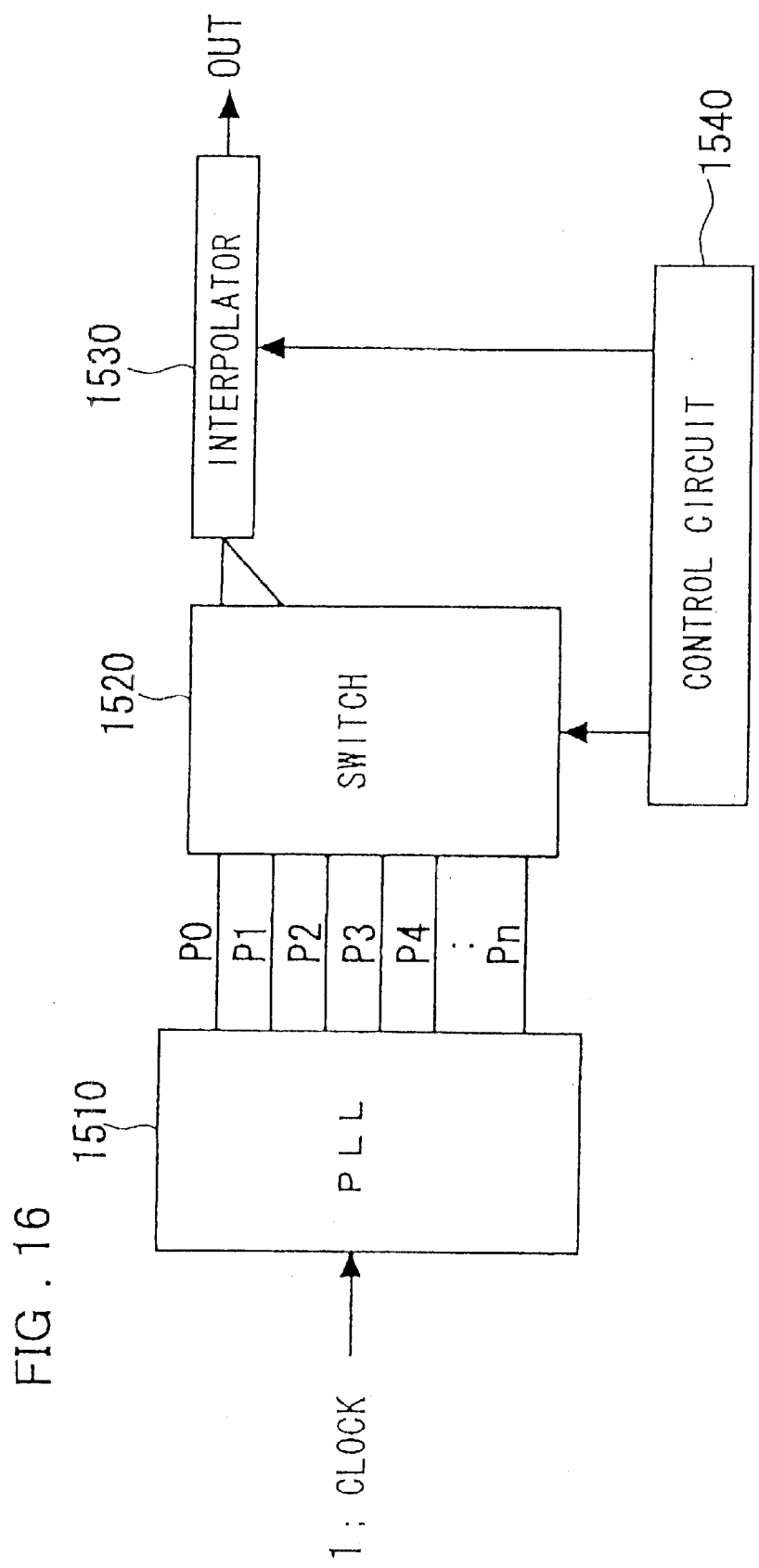
FIG. 16 is a diagram showing an example of the structure of a clock control circuit according to the prior art.

In the embodiment of the present invention, the interpolator includes the following as an arrangement for internally dividing the timing difference (phase difference) between both the rising edge and the falling edge of the clock signal, as shown in FIG. 15:

a first switch element group ($MP20_1$ to $MP20_n$) and a second switch element group ($MP21_1$ to $MP21_n$) stacked one above the other between a high-potential power supply (VDD) and the internal node (N101), wherein the first switch element group, which is composed of parallel-connected switch elements, has the input signal (IN1) from the first input terminal or a signal that is the inverse of this input signal input commonly to control terminals thereof and the second switch element group, which is composed of parallel-connected switch elements, has the interior-division ratio control signal bits (C0 to Cn−1) input to respective ones of the control terminals thereof;

a third switch element group ($MN21_1$ to $MN21_n$) and a fourth switch element group ($MN20_1$ to $MN20_n$)

stacked one above the other between the internal node (N101) and a low-potential power supply (VSS), wherein the third switch element group, which is composed of parallel-connected switch elements, has the interior-division ratio control signal bits (C0 to Cn−1) input to respective ones of the control terminals thereof and the fourth switch element group, which is composed of parallel-connected switch elements, has the input signal (IN2) from the second input terminal or a signal that is the inverse of this input signal input commonly to control terminals thereof;

a fifth switch element group ($MP10_1$ to $MP10_n$) and a sixth switch element group ($MP11_1$ to $MP11_n$) stacked one above the other between the high-potential power supply (VDD) and the internal node (N101), wherein the fifth switch element group, which is composed of parallel-connected switch elements, has the input signal (IN2) from the second input terminal or a signal that is the inverse of this input signal input commonly to control terminals thereof and the sixth switch element group, which is composed of parallel-connected switch elements, has complementary signal bits (CB0 to CBn−1) of the interior-division ratio control signal input to respective ones of the control terminals thereof; and a seventh switch element group ($MN11_1$ to $MN11_n$) and an eighth switch element group ($MN10_1$ to $MN10_n$) stacked one above the other between the internal node (N101) and the low-potential power supply (VSS), wherein the seventh switch element group, which is composed of parallel-connected switch elements, has complementary signal bits (CB0 to CBn−1) of the interior-division ratio control signal input to respective ones of the control terminals thereof and the eighth switch element group, which is composed of parallel-connected switch elements, has the input signal from the second input terminal or a signal that is the inverse of this input signal input commonly to control terminals thereof.

A buffer circuit (BUF 101) is provided and has an input terminal connected to the internal node (N101) for inverting the output logic value if the size relationship between the potential at the internal node (N101) and a threshold value reverses.

In the interpolator in accordance with the embodiment of the present invention, a plurality of series circuits (MN11 and CAP11, MN12 and CAP12, MN13 and CAP13, and MN15 and CAP15, which are connected in parallel, as shown in FIG. 13) each comprising a switch element and a capacitor are connected in parallel between the internal node and the second power supply (the low-potential power supply). The switch elements MN11 to MN15 are turned on or off by a period control signal (output from a clock-period detection circuit, etc., or set manually) connected to the control terminals of the switch elements (MN11 to MN15 in FIG. 13), thereby changing the value of capacitance applied to the internal node. As a result, this arrangement is capable of supporting phase adjustment of clock signals over a wide frequency range.

Embodiments of the present invention will further be described in greater detail with reference to the drawings.

Described first will be an example of the structure of an interpolator used in an embodiment of the present invention. FIG. 13 is a diagram showing an example of the structure of an interpolator (130 in FIG. 1) used in this embodiment.

As shown in FIG. 13, the interpolator 30 includes: an OR gate OR01 to which first and second input signals IN1 and IN2 are applied; a P-channel MOS transistor MP01 having a source connected to a power supply VDD, a drain connected to an internal node N31 and a gate which receives the output signal of the OR gate OR01; an inverter INV03 having an input terminal connected to the internal node N31 and an output terminal for producing an output signal; N-channel MOS transistors MN21, MN23 and MN25 constituting a first group of switch elements whose drains are connected in common with the internal node N31 and which are turned on and off by a control signal C (C0, C1 and C2) connected to respective gates thereof from an interpolator control circuit 120; N-channel MOS transistors MN22, MN24 and MN26 having drains connected to the sources of the N-channel MOS transistors MN21, MN23 and MN25, respectively, sources connected to respective ones of constant-current sources I0 and gates to which the first input signal IN1 is commonly applied; N-channel MOS transistors MN27, MN29 and MN31 whose drains are connected in common with the internal node N31 and which are turned on and off by a control signal CB (CB0, CB1 and CB2), connected to respective gates thereof from the interpolator control circuit 120; and N-channel MOS transistors MN28, MN30 and MN32 having drains connected to the sources of the N-channel MOS transistors MN27, MN29 and MN31, respectively, sources connected to respective ones of constant-current sources I0 and gates to which the second input signal IN2 is applied.

Furthermore, connected in parallel between the internal node N31 and ground are series circuits (MN11 and CAP11, MN12 and CAP12, MN13 and CAP13, MN14 and CAP14, and, MN15 and CAP15) each composed of a switch element, which comprises an N-channel MOS transistor, and a capacitor. The N-channel MOS transistors MN11 to MN15 are turned on or off by a period control signal connected to the gates of the N-channel MOS transistor MN11 to MN15, thereby deciding the capacitance applied to the internal node N31. The capacitances CAP11, CAP 12, CAP 13, CAP 14 and CAP 15 have capacitance values C, 2C, 4C, 8C and 16C, respectively, and the period control signal applied to the N-channel MOS transistors MN11 to MN15 is set to a value that corresponds to the clock period detected by a cycle sensing circuit, which is not shown. It should be noted that the period control signal might be set manually from switches or the like. Further, the value of capacitance applied to the internal node N31 may be fixed. In such case the parallel circuits of the switch elements and capacitors (MN11 and CAP11, MN12 and CAP12, MN13 and CAP13, MN14 and CAP14 and MN15 and CAP15) may be deleted from the interpolator.

The current (drain current) that flows into one of the parallel-connected N-channel MOS transistors (MN21, MN23, MN25, MN27, MN29 and MN31) is I (the current value of the constant-current source $I_0$). Let V represent a threshold voltage at which the output of the inverter INV03 changes state, and let CV represent the amount of change in electric charge up to attainment of this threshold voltage V. Further, assume that the control signal C (C0 to C2) input to the gates of the N-channel MOS transistors MN21, MN23 and MN25 constituting the first switch group and the control signal CB (CB0 to CB2) input to the gates of the N-channel MOS transistors MN27, MN29 and MN31 constituting the second switch group are complementary. For example, assume that when the control signal C input to the gates of the N-channel MOS transistors MN21, MN23 and MN25 is "100", the control signal CB input to the gates of the N-channel MOS transistors MN27, MN29 and MN31 is "011". The combinations of the control signals C and CB are as follows if there are two sets of three parallel-connected switch elements (NMOS transistors), for a total of six switch elements:

| Control Signal C | Complementary Signal CB |
|---|---|
| "000" | "111" |
| "001" | "110" |
| "011" | "100" |
| "111" | "000" |

Assume now that the input signals IN1, IN2 are both at the low level, so that the output of the OR gate OR01 is at a low level and the internal node N31 has been charged (bringing the output of the inverter INV03 to the low level) from the side of the power supply VDD via the P-channel MOS transistor MP01. Operation in a case where the input signals IN1 and IN2 rise to a high level will now be described.

Described first will be a case where the interior-division ratio of the phase difference between the two input signals IN1 and IN2 to the interpolator 130 is an upper-limit value (i.e., a case where the delay time of the output signal is minimum). It will be assumed that the control signal C is "111" and that the complementary control signal CB is "000". All of the N-channel MOS transistors MN21, MN23 and MN25 constituting the first switch group connected to the N-channel MOS transistors MN22, MN24 and MN26 having the input signal IN1 applied in common to the gates thereof are turned on, and all of the N-channel MOS transistors MN27, MN29 and MN31 constituting the second switch group connected to the N-channel MOS transistors MN28, MN30 and MN32 having the input signal IN2 applied in common to the gates thereof are turned off. As a result, among the six parallel-connected N-channel MOS transistors MN22, MN24, MN26, MN28, MN30 and MN32, the three N-channel MOS transistors MN22, MN24 and MN26 having the input signal IN1 applied in common to the gates thereof are turned on by the rising edge of the input signal IN1.

A time T(3) required for the output of the inverter INV03 to change state after the input signal IN1 rises to a high level is given by the following equation, where I represents the current of each constant-current source:

$$T(3) = CV/(3 \cdot I) \qquad (1)$$

In a case where n-number (n<3) of the switches in the first switch group are turned on by the control signal C, i.e., in a case where the control signal C is "011", "001" or "000", n-number of the N-channel MOS transistors among the N-channel MOS transistors MN22, MN24 and MN26 having the input signal IN1 applied in common to the gates thereof turn on in the period of time T (where T represents the timing difference between the rising edges of the input signals IN1 and IN2) from the timing of the transition to the high level of the input signal IN1, as a result of which an electric charge $n \cdot I \cdot T$ is discharged.

Next, in response to the transition of the input signal IN2 to the high level, (3−n)-number of the N-channel MOS transistors among the N-channel MOS transistors MN28, MN30, and MN32 having the input signal IN2 applied in common to the gates thereof turn on, so that n+3−n=3, i.e., a total of three, N-channel MOS transistors turn on.

As a result, electric charge $(CV - n \cdot I \cdot T)$ that remains on the internal node N31 is discharged by current (3·I) and the output of inverter INV03 changes state (from the low to the high level) at time $(CV - n \cdot I \cdot T)/(3 \cdot I)$.

Accordingly, the time (propagation delay time) T(n) it takes for the output of the inverter INV03 to change state after the input signal IN1 rises to the high level is as given by the following equation:

$$\begin{aligned} T(n) &= T + (CV - n \cdot I \cdot T)/(3 \cdot I) \\ &= CV/(3 \cdot I) - (n/3)T + T \\ &= T(3) + (3 - n)/3 \cdot T \end{aligned} \qquad (2)$$

As indicated by the equation (2) above, there are obtained output signals of delay-time T(n) corresponding to a time obtained by interior-division at a value stipulated by n, where three equal parts of the timing difference T between the input signals IN1 and IN2 depending upon the value of n (n=0, 1, 2, 3) (the value of the control signal C) are adopted as the units. That is, by varying n by the setting of the control signal C (CB), there can be obtained an output signal of any phase that is the result of dividing (internally dividing) the timing difference between the input signals IN1 and IN2 at a resolution of 1/3. Such an interpolator is referred to also as a "3-step interpolator". For example, n=3 is made the lower limit of the interior-division ratio [the delay time of the output signal of the interpolator is minimum at T(3)] and n=0 is made the upper limit of the interior-division ratio [the delay time of the output signal of the interpolator is maximum at T(3)+T].

In FIG. 13, the three parallel-connected MOS transistors MN21, MN23 and MN25 and the three parallel-connected MOS transistors MN27, MN29 and MN31 can be made sets of N-number of parallel-connected MOS transistors each, thereby constructing an N-step interpolator.

If in such case the control signal C, in which n bits are logic "1" and (N−n) bits are logic "0", and its complementary signal CB are input to N-number of parallel-connected pairs of transistor groups (which correspond to transistors MN21, MN23, MN25 and MN27, MN29 and MN31), respectively, then delay time T(n) will be given by the following equation, where T represents the time difference between the input signals IN1 and IN2:

$$\begin{aligned} T(n) &= CV/(N \cdot I) - (n/N)T + T \\ &= T(N) + (N - n)/N \cdot T \end{aligned} \qquad (3)$$

The circuit structure of the interpolator shown in FIG. 13 generates an output signal of delay time corresponding to time obtained by internally dividing the timing difference T between the rise transitions of the input signals IN1 and IN2. However, an interpolator that generates an output signal of delay time corresponding to time obtained by internally dividing the timing difference T between the fall transitions of the input signals IN1 and IN2 can have a NAND gate instead of the OR gate, in which the signals obtained by inverting the input signals IN1 and IN2 by an inverter are input to N-channel MOS transistors M21, M23 and M25 and the N-channel MOS transistors MN27, MN29 and MN31, respectively. It should be noted that the inverter INV03 connected to the internal node might of course be a non-inverting buffer, depending upon the logic of the application used.

It should be also noted that in FIG. 13, the arrangement of N-channel MOS transistors M21, M23 and M25 and N-channel MOS transistors M22, M24 and M26 may be interchanged. More specifically, drains of N-channel MOS transistors M22, M24 and M26 each receiving from a gate in common an input signal from an input terminal IN1 may be connected in common to the internal node N31 and drains of N-channel MOS transistors M21, M23 and M25 each receiving from a gate a control signal respectively may be connected to sources of N-channel MOS transistors M22, M24 and M26, while sources of N-channel MOS transistors M21, M23 and M25 are respectively connected to current sources I0. Also, in the same way, drains of N-channel MOS transistors M28, M30 and M32 each receiving from a gate in common an input signal from an input terminal IN2 may be connected in common to the internal node N31 and drains of N-channel MOS transistors M27, M29 and M31 each receiving from a gate a control signal respectively may be connected to sources of N-channel MOS transistors M28, M30 and M32 while sources of N-channel MOS transistors M27, M29 and M31 are respectively connected to current sources I0.

The forward/reverse relationship of the phases of the clock signals supplied to the interpolator as the input signals IN1 and IN2 (see FIG. 13), and the relationship between the interior-division control signals C, B.

Figure 14:
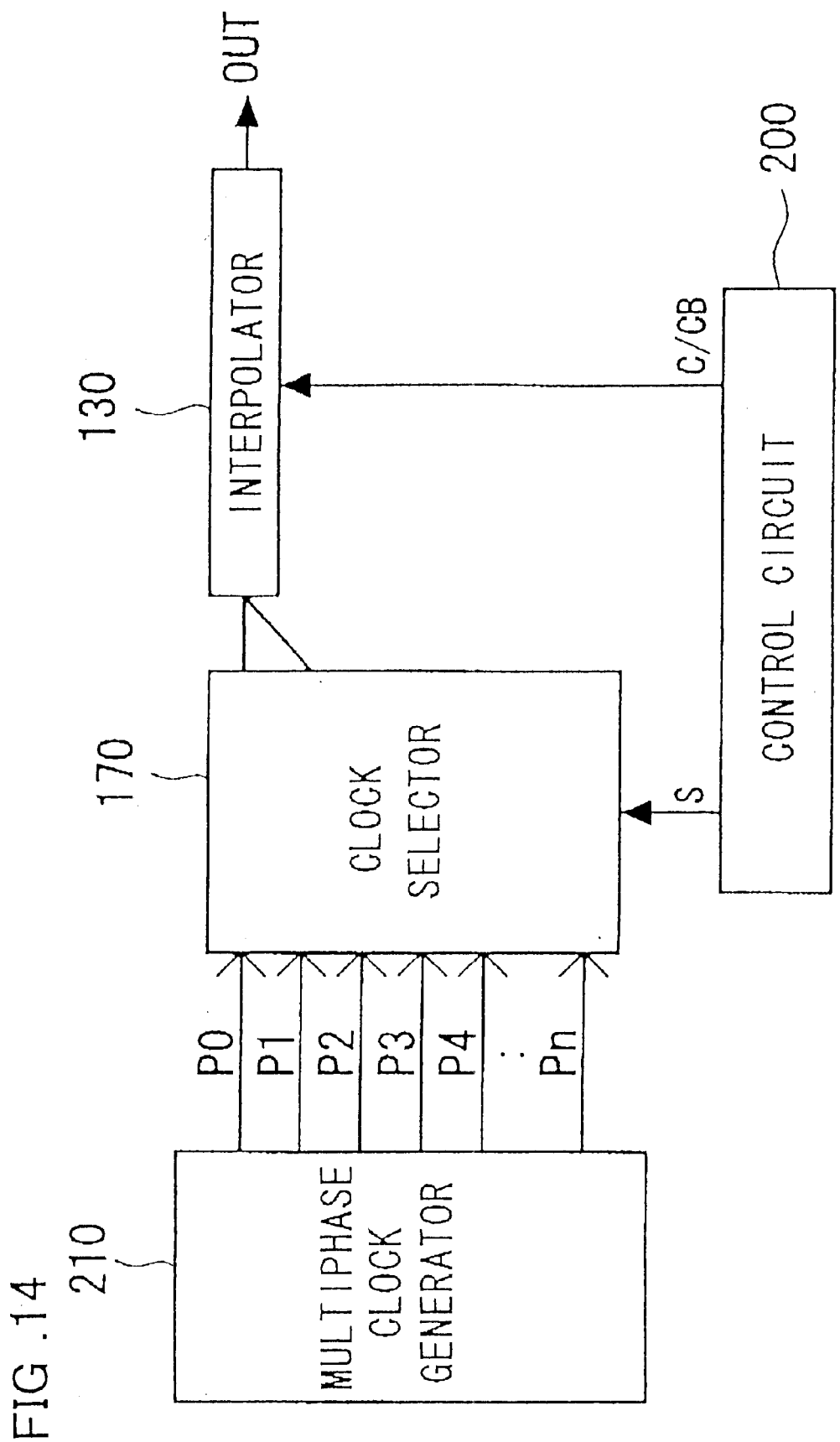
FIG. 14 is a diagram showing an example of the structure of a clock control circuit using an interpolator according to the present invention.

As mentioned above, in the clock control signal having the structure shown in FIG. 14, for example, let the suffix n of multiphase clocks P0 to Pn be 2m−1 (the number of phases of the multiphase clocks is 2m). The clock selector 170 includes a first selector which, in response to the clock selection control signal S from the control circuit 200, selects one of the odd-phase clocks P0, P2, P4, ···, P2m−2, and a second selector which, in response to the clock selection control signal S from the control circuit 200, selects one of the even-phase clocks P1, P3, P5, ···, P2m−1. The control circuit 200 performs control to change over the clock output in such a manner that the combination of the odd-, even-phase clock output pair supplied to the interpolator 130, which internally divides the phase difference, will be a clock pair of mutually adjacent odd- and even-phase clocks, e.g., (P0, P1), (P2, P1), (P2, P3) and so on.

For example, the (P0, P1) clock signal pair (where P1 lags behind P0 by the time difference T) is selected by the clock selector 170. The phases of the input signals IN1 and IN2 of the interpolator 130 are in a forward (positive) relationship.

If, in a case where the interior-division ratio of time difference T between P0 and P1 in the interpolator 130 is n=0 in the equation (3) cited above (the control signal C is "000···0" and its complementary signal CB is "111···1"), the phase of the output signal of the interpolator is delayed further, then the (P2, P1) clock signal pair is selected by the clock selector 170. In this case, clock signal P2 the phase of which lags behind that of clock signal P1 is supplied as the input signal IN1 instead of the clock signal P0, and the original clock P1 is supplied as the input signal IN2.

That is, in a case where the (P2, P1) clock signal pair has been selected by the clock selector 170, the input signal IN2 (see FIG. 13) input to the second input terminal of the interpolator will be leading the input signal IN1 (see FIG. 13) input to the first input terminal. The phases of the input signals IN1 and IN2 of the interpolator 130 will have a relationship that is the reverse of that in the case of signals (P0 and P1).

As a result, a control signal corresponding to the phase-delayed input signal is supplied as the control signal applied to the N-channel MOS transistors MN21, MN23 and MN25 constituting the first switch group connected to the N-channel MOS transistors MN22, MN24 and MN26 having the input signal IN1 applied to the gates thereof, and a control signal corresponding to the phase-advanced input signal is supplied as the control signal applied to the N-channel MOS transistors MN27, MN29 and MN31 constituting the second switch group connected to the N-channel MOS transistors MN28, MN30 and MN32 having the input signal IN2 applied to the gates thereof.

In a case where the (P2, P1) clock signal pair has been selected by the clock selector 170, the lower limit of the interior-division ratio of the interpolator 130 will be obtained (the delay time of the interpolator output signal within this set range of interior-division ratios will be minimum) when all bits of the control signal CB are logic "1" (all bits of the control signal C are logic "0"), and the upper limit of the interior-division ratio of the interpolator 130 will be obtained (the delay time of the interpolator output signal within this set range of interior-division ratios will be maximum) when all bits of the control signal CB are logic "0" (all bits of the control signal C are logic "1").

On the other hand, in a case where the (P0, P1) clock signal pair has been selected by the clock selector 170, the lower limit of the interior-division ratio of the interpolator 130 will be obtained (the delay time of the interpolator output signal will be minimum) when all bits of the control signal C are logic "1" (all bits of the control signal CB are logic "0"), and the upper limit of the interior-division ratio of the interpolator 130 will be obtained (the delay time of the interpolator output signal within this set range of interior-division ratios will be maximum) when all bits of the control signal C are logic "0" (all bits of the control signal CB are logic "1").

The lead/lag relationship of the phases of the input signals IN1, IN2 of interpolator 130 changes over between one relationship in a case where the (P2, P1) clock signal pair is selected by the clock selector 170 and a case where the (P0, P1) clock signal pair is selected. The logic of the control signals C, and CB supplied to the first and second groups of switches is changed over in order to set the interior-division ratio of the interpolator 130. When the clock pair is changed, the setting of the control signals C/CB of the interior-division ratio of the interpolator is swapped. That is, the connections between the two input terminals of the interpolator 130 and the two output terminals of the clock selector 170 are not changed over and the logic of the control signals C, and CB is swapped in the control circuit 200 in operative association with the changeover of the clock selection.

In an embodiment of the present invention, as will be described later, control for swapping the set logic of the control signals C/CB in the control circuit that supplies the interior-division control signal to the interpolator is carried out based upon the value of flag signal JBTFLG.

FIG. 1 is a diagram showing the overall circuit structure of this embodiment of the clock control circuit according to the present invention. As shown in FIG. 1, the clock control circuit comprises the phase comparator circuit 110 for detecting, by comparison, a phase difference between a reference signal (Ref) and the output signal (OUT) of the interpolator 130; the up/down-signal control circuit 140, to which an up signal UP and a down signal DN, which constitute the phase-comparison result signal output from the phase comparator circuit 110, for outputting an up signal F_UP and a down signal F_DN to the ring counter 100 when signal ENDFLG is in an active state; the ring counter 100 having the up signal F_UP and down signal F_DN input thereto; the rescue/flag generating circuit 150; the decoder circuit 160 which receives the outputs of the rescue/flag generating circuit 150 and outputs a decoded signal; the clock selector 170, which receives multiphase clocks and outputs a pair of clock signals; the interpolator 130; and the interpolator control circuit 120, which receives the up signal UP and down signal DN from the phase comparator circuit 110 and outputs the control signal and its complementary signal CB for controlling the interior-division ratio of the interpolator 130, as well as the signal ENDFLG indicating that the interior-division ratio is an extremal point (upper limit or lower limit).

When the signal ENDFLG output from the interpolator control circuit 120 is in an active state, the up/down-signal control circuit 140 performs gate control to output the up signal UP and down signal DN from the phase comparator circuit 110 to the ring counter 100 as the up signal F_UP and down signal F_DN, respectively.

Figure 2:
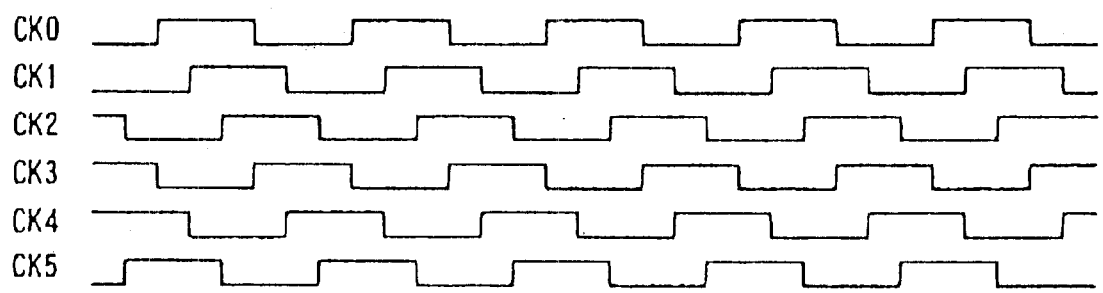
FIG. 2 is a diagram showing the waveforms of multiphase clock in the clock control circuit of this embodiment.

In the example shown in FIG. 1, clocks (CK0 to CK5) of six phases shown in FIG. 2 are supplied to the clock selector 170. The 6-phase clocks input to the clock selector 170 may be generated using a frequency multiplying interpolator (see the specification of Japanese Patent Application No. 2000-083579), which generates multiphase clocks by first frequency dividing a reference clock (Ref) and then frequency multiplying the frequency-divided signal, or by using the VC0 output of a-PLL circuit or any other multiphase clock generating circuit.

The ring counter 100 outputs a signal of three bits (non-inverted outputs of three flip-flops constructing a counter) and signals (inverted outputs of three flip-flops constructing a counter) obtained by inverting the signals of the three bits.

The up/down-signal control circuit 140, ring counter 100, rescue/flag generating circuit 150, decoder circuit 160 and interpolator control circuit 120 in FIG. 1 composes the control circuit 200 of FIG. 14. In this embodiment, the 6-phase clocks are generated using a multiphase clock generator (210 in FIG. 14) of any construction. It goes without saying that the multiphase clocks in this invention are not limited to 6-phase clocks.

Figure 12:
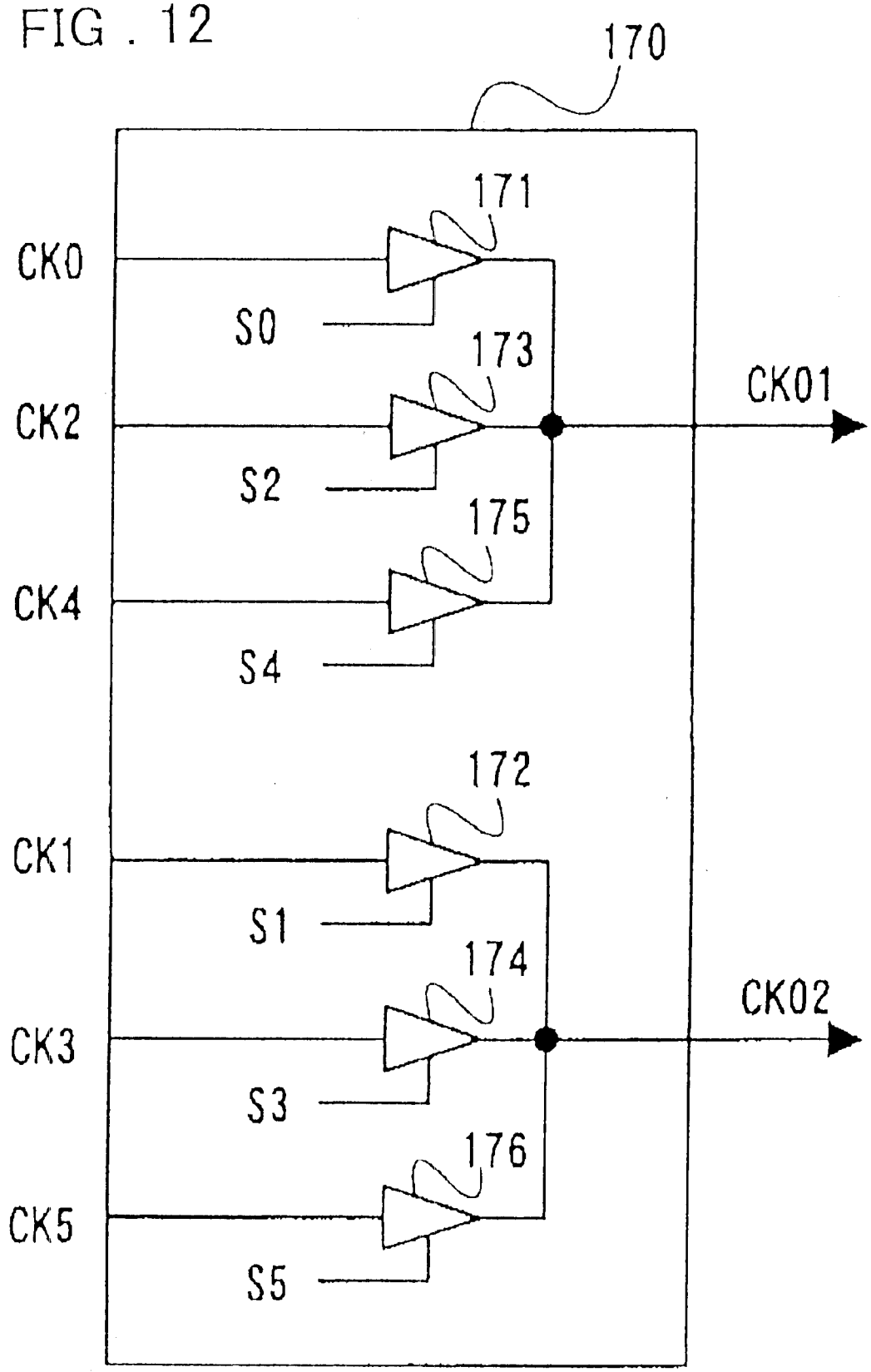
FIG. 12 is a diagram showing an example of the structure of clock selector according to this embodiment.

FIG. 12 is a diagram shown an example of the structure of the clock selector 170 of FIG. 1. Referring to FIG. 12, the clock selector 170 includes three tri-state buffers 171, 173 and 175 to which clocks CK0, CK2 and CK4 of even-numbered phases among the 6-phase clocks CK0 to CK5 are input and the outputs of which are tied together and connected to an output terminal CK01; and three tri-state buffers 172, 174 and 176 to which clocks CK1, CK3 and CK5 of odd-numbered phases among the 6-phase clocks CK0 to CK5 are input and the outputs of which are tied together and connected to an output terminal CK02.

Clock selection control signals S0 to S5 are fed to output enable terminals of the tri-state buffers 171, 173, 175, 172, 174 and 176. When the value of a clock selection control signal is logic "1", an output-enable state is attained; when the value of a clock selection control signal is logic "0", an output-disable state is attained (the output attains a high-impedance state). The clock selector 170 outputs one of the even-phase clocks CK0, CK2 and CK4 from an output terminal CK01 and outputs an odd-phase clock of the phase neighboring the even-phase clock. It should be noted that the clock selector 170 may have any structure so long as it outputs a pair of clocks based upon the clock selection control signals S0 to S5; the invention is not limited to the arrangement shown in FIG. 12.

The structure of the decoder circuit 160 according to this embodiment of the present invention will be described next. FIG. 4 illustrates a truth-value table representing the operation of the decoder circuit 160, which generates six signals (the clock selection control signals) of six bits each from six signals each expressed by three bits in binary representation. A 3-bit signal (FF1, 2, 3) output from three flip-flops constructing the ring counter 100 and a 3-bit signal [FF1, 2, 3 (inverted)] obtained by inverting these signals, for a total of six bits, are input to the decoder circuit 160, which generates the 6-bit signal that is the result of decoding. This code conversion makes it possible to obtain a decoded result merely by inverting only one bit of the six bits composed of the 3-bit signal and its inverted 3-bit signal. This raises the efficiency of the circuitry.

As shown in FIG. 4, in the case of a clock selection control signal "000110", which is the result of decoding, with respect to a 6-bit input pattern "000111" composed of the 3-bit signal (F1, 2, 3) and its inverted signal [FF1, 2, 3 (inverted)], it suffices merely to invert the one bit at the right end of the 6-bit input pattern.

In the case of "100011"→"000011" (the arrow indicates the result of decoding) of the next row, it suffices to merely invert the one bit at the left end of the 6-bit input pattern.

In the case of "110001"→"100001" of the third row, it suffices to merely invert the second bit from the left end of the 6-bit input pattern.

In the case of "111000"→"110000" of the fourth row, it suffices to merely invert the third bit from the left end of the 6-bit input pattern.

In the case of "011100"→"011000" of the fifth row, it suffices to merely invert the fourth bit from the left end of the 6-bit input pattern.

Similarly, in the case of "001110"→"001100" of the sixth row, it suffices to merely invert the fifth bit from the left end of the 6-bit input pattern.

In the case of "000111"→"000110" of the seventh row, it suffices to merely invert the sixth bit from the left end of the 6-bit input pattern. The seventh row is identical with the first row.

Figure 5:
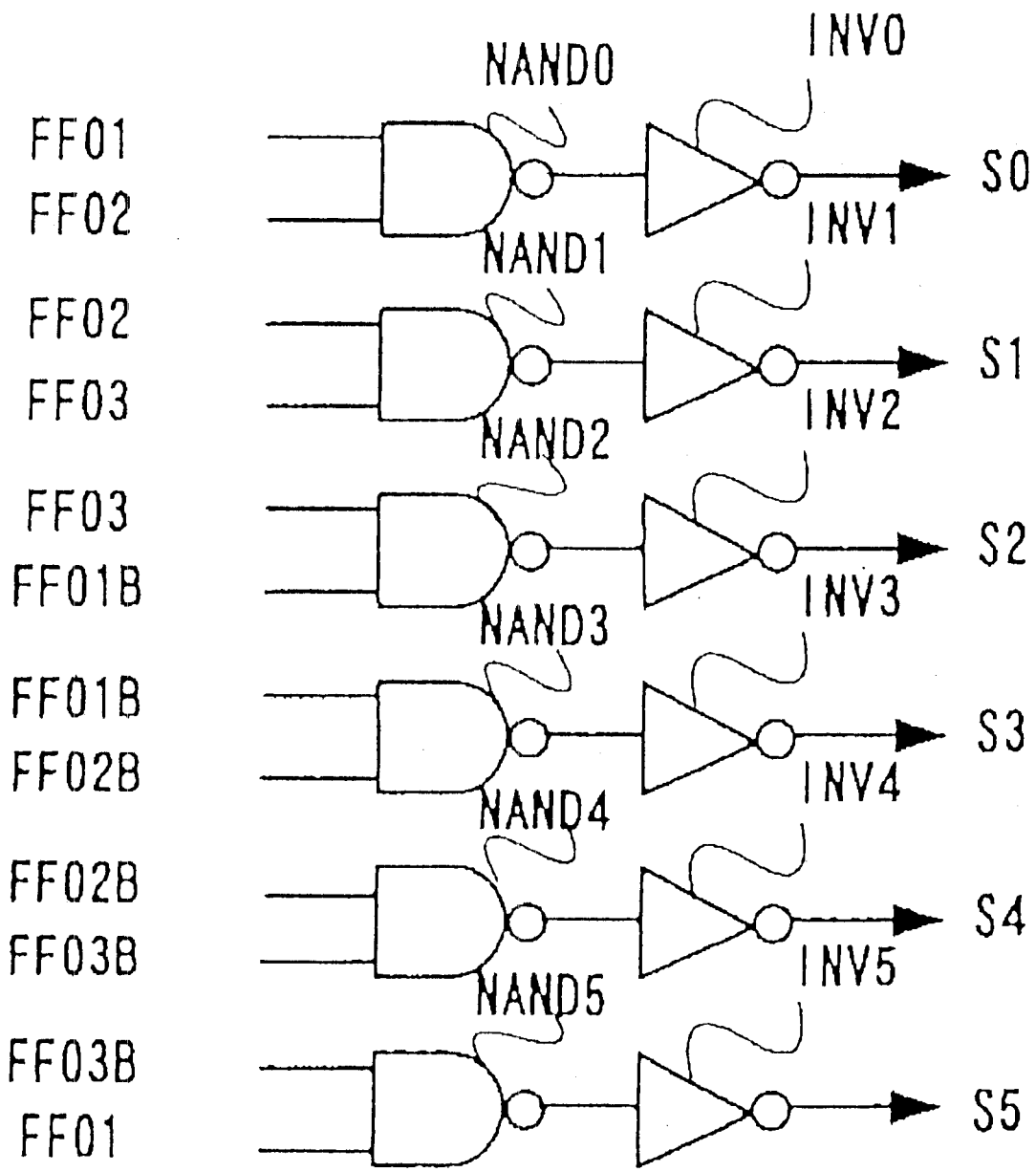
FIG. 5 is a diagram illustrating an example of the structure of a decoder circuit according to this embodiment.

FIG. 5 is a diagram illustrating an example of the structure of the decoder circuit 160 (see FIG. 1) represented by the truth-value table of FIG. 4. In FIG. 5, FF01, FF02, and FF03 represent output signals of non-inverted output terminals Q of three flip-flops constructing the ring counter, and FF01B, FF02B and FF03B represent output signals of inverted output terminals QB of three flip-flops constructing the ring counter.

As shown in FIG. 5, the decoder circuit 160 (see FIG. 1) is implemented by, e.g., the following logic, with regard to the 6-bit clock selection control signal (S0, S1, S2, S3, S4 and S5):

S0=AND (FF01, FF02)
S1=AND (FF02, FF03)
S2=AND (FF03, FF01B)
S3=AND (FF01B, FF02B)
S4=AND (FF02B, FF03B)
S5=AND (FF03B, FF01)

In other words, the decoder circuit 160 has a simple structure composed of six 2-input AND gates. NAND gates and inverters INV constituting the basic cell, as illustrated in FIG. 5 implement the actual circuit arrangement on the semiconductor integrated circuit.

From a signal having a width of six bits (FF01, FF02, FF03, FF01B, FF02B and FF03B) comprising the signal of three bits (FF01, FF02 and FF03) and the signal of inverted bits (FF01B, FF02B and FF03B), signals of an Ith bit and an (I+1)th bit (where I is 1, 2, ~N, and 2N+1 becomes 1 when I is 2N) are input to an Ith 2-input NAND gate.

Figure 6:
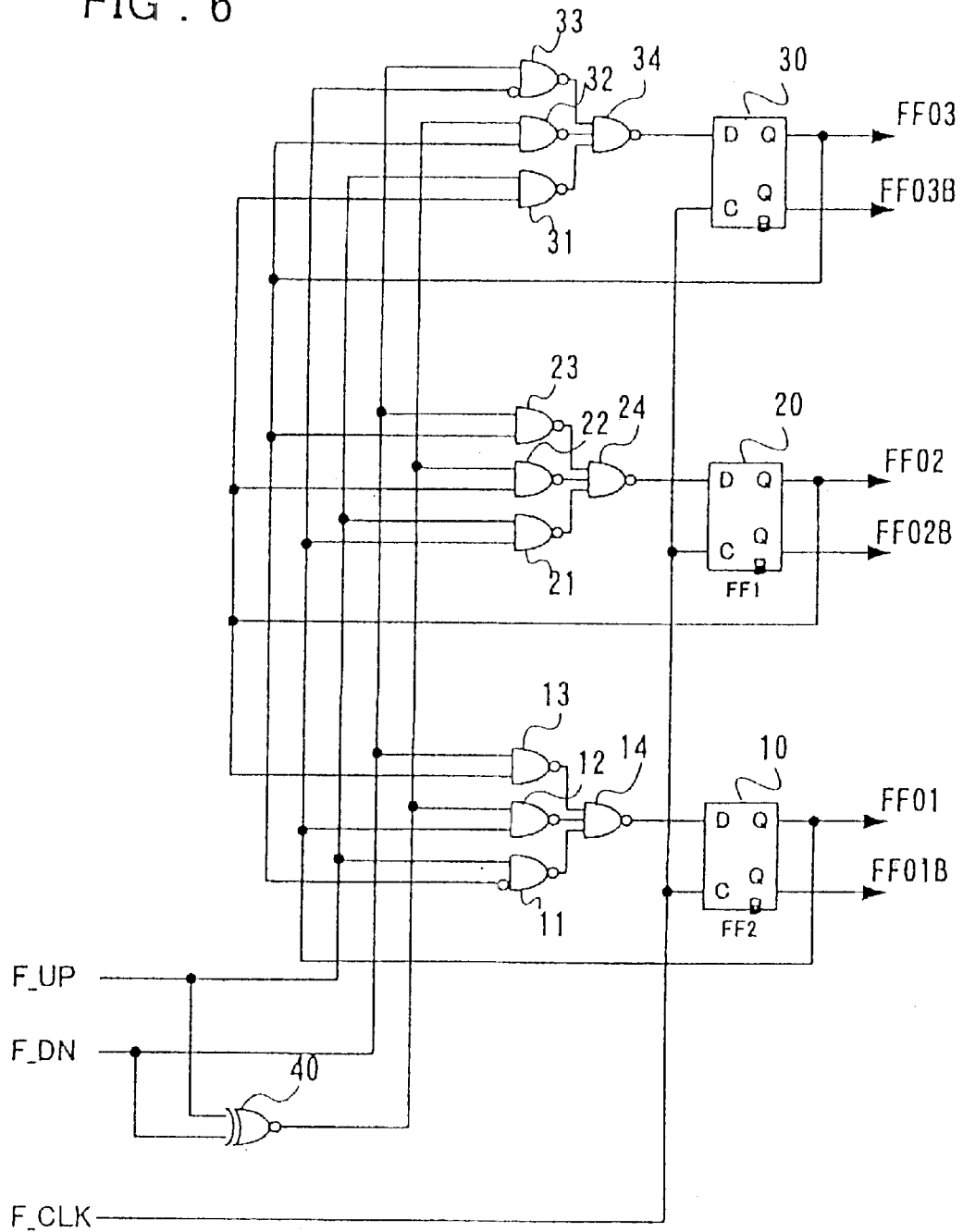
FIG. 6 is a diagram illustrating an example of the structure of a ring counter according to this embodiment.

FIG. 6 is a diagram illustrating the structure of the ring counter 100 (see FIG. 1) for generating the 3-bit signal and the inverted signal thereof supplied to the input terminals of the decoder 160. The ring counter 100, which has the up signal F_UP and down signal F_DN input thereto as control signals, is such that its counting direction changes over freely between up and down directions. Furthermore, when the up signal F_UP and down signal F_DN are either active (or both inactive), the ring counter 100 is placed in the hold state.

More specifically, as shown in FIG. 6, the ring counter 100 has three D-type flip-flops 10, 20 and 30. The non-inverting outputs of the flip-flops 10, 20 and 30 deliver six patterns of 3-bit signals, and the inverting outputs of the flip-flops 10, 20 and 30 deliver inverted signals obtained by inverting the 3-bit signals.

Provided in correspondence with the flip-flop 10 is a first logic circuit, which has an output signal from each of the three flip-flops 10, 20 and 30, the up signal F_UP specifying the up operation of the counter, the down signal F_DN specifying the down operation of the counter, and the output signal of the coincidence detection circuit 40 input thereto, for specifying upcount/downcount and hold operating states of the ring counter.

The first logic circuit has a NAND gate 11 which receives the signal F_UP and the inverted signal of output Q of flip-flop 30, a NAND gate 12 which receives the output of the coincidence detection circuit 40 and the output of the flip-flop 10, a NAND gate 13 which receives the output of the flip-flop 20 and the signal F_DN, and a NAND gate 14 which receives the outputs of the NAND gates 11 to 13. The output of the NAND gate 14 is supplied to the data input terminal D of the flip-flop 10.

Provided in correspondence with the flip-flop 20 is a second logic circuit, which has an output signal from each of the three flip-flops 10, 20, 30, the up signal F_UP specifying the up operation of the counter, the down signal F_DN specifying the down operation of the counter, and the output signal of the coincidence detection circuit 40 input thereto, for specifying upcount/downcount and hold operating states of the ring counter.

The second logic circuit has a NAND gate 21 which receives the signal F_UP and the output Q of flip-flop 10, a NAND gate 22 which receive the output of the coincidence detection circuit 40 and the output of the flip-flop 20, a NAND gate 23 which receives the output of the flip-flop 30 and the signal F_DN, and a NAND gate 24 which receives the outputs of the NAND gates 21 to 23. The output of the NAND gate 24 is supplied to the data input terminal D of the flip-flop 20.

Provided in correspondence with the flip-flop 30 is a third logic circuit, which has an output signal from each of the three flip-flops 10, 20, 30, the up signal F_UP specifying the up operation of the counter, the down signal F_DN specifying the down operation of the counter, and the output signal of the coincidence detection circuit 40 input thereto, for specifying upcount/downcount and hold operating states of the ring counter.

The third logic circuit has a NAND gate 31 which receives the signal F_UP and the output Q of flip-flop 20, a NAND gate 22 which receives the output of the coincidence detection circuit 40 and the output of the flip-flop 30, a NAND gate 33 which receives the output of the flip-flop 10 and the signal F_DN, and a NAND gate 34 which receives the outputs of the NAND gates 31 to 33. The output of the NAND gate 34 is supplied to the data input terminal D of the flip-flop 30.

The operation of the ring counter shown in FIG. 6 will now be described. First, when the outputs Q of the flip-flops 10, 20 and 30 are all logic "0" and the up signal F_UP is logic "1", for example, the output of NAND gate 11 becomes logic "0", the output of NAND gate 14 becomes logic "1" and flip-flop 10 outputs logic "1" in response to the clock F_CLK. At this time logic "0" appears at the data input terminals D of the flip-flops 20 and 30, the flip-flops 20 and 30 output logic "0" and the non-inverted outputs of the flip-flops 10, 20 and 30 become "100".

As a result of output FF01 of flip-flop 10 becoming logic "1", the output of NAND gate 21 becomes logic "0" and NAND gate 24 outputs logic "1". Flip-flop 10 outputs logic "1" in response to the clock F_CLK. The non-inverted outputs of flip-flops 10, 20 and 30 become "110".

As a result of output FF02 of flip-flop 20 becoming logic "1", the output of NAND gate 31 becomes logic "0" and NAND gate 34 outputs logic "1". Flip-flop 30 outputs logic "1" in response to the clock F_CLK. The non-inverted outputs of flip-flops 10, 20 and 30 become "111".

As a result of output FF03 of flip-flop 30 becoming logic "1", the output of NAND gate 11 becomes logic "1" and NAND gate 14 outputs logic "0". Flip-flop 10 outputs logic "0" in response to the clock F_CLK. The non-inverted outputs of flip-flops 10, 20 and 30 become "011".

As a result of output FF01 of flip-flop 10 becoming logic "0", the output of NAND gate 21 becomes logic "1" and NAND gate 24 outputs logic "0". Flip-flop 20 outputs logic "0" in response to the clock F_CLK. The non-inverted outputs of flip-flops 10, 20 and 30 become "001".

As a result of output FF02 of flip-flop 20 becoming logic "0", the output of NAND gate 31 becomes logic "1" and NAND gate 34 outputs logic "0". Flip-flop 30 outputs logic "0" in response to the clock F_CLK. The non-inverted outputs of flip-flops 10, 20 and 30 become "000".

When signal F_DN is logic "1" (F_UP is logic "0"), the direction in which the pattern shifts is opposite that when the signal F_UP is logic "1" The output of NAND gate 33 becomes logic "0" and the output of NAND gate 34 becomes logic "1". Flip-flop 30 outputs logic "1" in response to clock F_CLK. The non-inverted outputs of flip-flops 10, 20 and 30 become "001".

As a result of output FF03 of flip-flop 30 becoming logic "1", the output of NAND gate 23 becomes logic "0" and NAND gate 24 outputs logic "1" Flip-flop 20 outputs logic "1" in re sponse to the clock F_CLK. The non-inverted outputs of flip-flops 10, 20 and 30 become "011".

As a result of output FF02 of flip-flop 20 becoming logic "1", the output of NAND gate 13 becomes logic "0" and NAND gate 14 outputs logic "1". Flip-flop 10 outputs logic "1" in response to the clock F_CLK. The non-inverted outputs of flip-flops 10, 20 and 30 become "111".

As a result of output FF0I of flip-flop 10 becoming logic "1", the output of NAND gate 33 becomes logic "1" and NAND gate 34 outputs logic "0". Flip-flop 30 outputs logic "0" in response to the clock F_CLK. The non-inverted outputs of flip-flops 10, 20 and 30 become "110" Each time when a clock signal is received subsequently, the transition is to "100" and then to "000".

When the values of the signals F_DN and F_UP coincide, the output of the coincidence detection circuit 40, which comprises an XNOR (exclusive-NOR) gate, becomes logic "1", the values of the non-inverting output-terminals Q of the flip-flops 10, 20 and 30 are fed back to the data input-terminals D of the flip-flops 10, 20 and 30, and the flip-flops 10, 20 and 30 sample and output the signals at the data input terminals D in response to the rising edge of the clock F_CLK. As a result, the flip-flops 10, 20 and 30 maintain their status.

Thus, the patterns of 3-bit outputs (FF01, FF02 and FF03) of the ring counter shown in FIG. 6 do not include patterns "010" and "101". If the pattern "010" or "101", which falls outside expectations, is produced owing to noise or the like, rescue is achieved by setting the pattern to any one of the patterns whose appearance is allowed.

The outside expectation and rescue/flag generating circuit 150 shown in FIG. 1 will now be described in detail. The outside expectation circuit of the outside expectation and rescue/flag generating circuit 150 converts the 3-bit signal "010" that is outside expectations to "000" and converts the 3-bit signal "001" that is outside expectations to "111" (see FIG. 4).

FIG. 7a is a diagram showing an example of the structure of the outside expectation and rescue circuit 50 in the rescue/flag generating circuit 150.

As shown in FIG. 7a, the outside expectation and rescue circuit 50 includes a NAND gate 51, the inputs to which are a signal FF01I obtained by inverting the signal from the non-inverting output terminal Q of flip-flop 10 by an inverter INV1, a signal FF02 from the non-inverting output terminal Q of flip-flop 20, and a signal FF03I obtained by inverting the signal from the non-inverting output terminal Q of flip-flop 30 by an inverter INV3, for outputting logic "0" when all of these inputs are at logic "1"; a NAND gate 52, the inputs to which are a signal FF01BI obtained by inverting the signal from the inverting output terminal QB of flip-flop 10 by an inverter INV2, a signal FF02B from the inverting output terminal QB of flip-flop 10, and a signal FF03BI obtained by inverting the signal from the inverting output terminal QB of flip-flop 30 by an inverter INV4, for outputting logic "0" when all of these inputs are at logic "1"; a NAND gate 53 to which the output signal of flip-flop 20 and the output signal of NAND gate 52 are input; and a NAND gate 54, to which the output signal of NAND gate 53 and the output signal of NAND gate 52 are input, for outputting a signal FF02DC.

The operation of the outside expectation and rescue circuit 50 will now be described. When the 3-bit signal from the non-inverting output terminals Q of flip-flops 10, 20 and 30 is "010", NAND gate 51 outputs logic "0", NAND gate 53 outputs logic "1", and logic "0", which is obtained by inverting the logic "1" output of NAND gate 52, is output from NAND gate 54 as FF02DC. When the 3-bit signal from the non-inverting output terminals Q of flip-flops 10, 20 and 30 are "101", NAND gate 52 outputs logic "0" and NAND gate 54 outputs logic "1" as FF02DC.

In a case where the rescue circuit 50 is provided, the signals input to the NAND gate 13, NAND gate 22 and NAND gate 31 in the ring counter shown in FIG. 6 employ the output signal FF02DC of rescue circuit 50 instead of the signal FF02.

Even if a bit pattern that is outside expectations is output as the output of ring counter 100, the fact that the outside expectation and rescue circuit 50 is provided make it possible to replace this pattern with a bit pattern whose appearance is allowed and to supply this allowed bit pattern to the decoder circuit 160. As a result, selection of the clock pair by the clock selector 170 and the phase adjusting operation by the interpolator 130 can be performed unerringly. If the rescue circuit 50 is not provided, on the other hand, the pattern outside expectations is input to the decoder circuit 160 as is and, hence, it may not be possible to assure what decoded result will be obtained from the decoder circuit 160. There is also a possibility that the phase adjustment will not be performed normally.

FIG. 7b is a diagram showing the structure of a flag generating circuit in the rescue/flag generating circuit 150 of FIG. 1.

As shown in FIG. 7b, the flag generating circuit generates the flag signal JBTFLG (which is input to the interpolator control circuit 120). The value of the signal JBTFLG is inverted (toggles between even and odd numbers) whenever the selection of the clock is changed over, as illustrated in FIG. 4. The flag generating circuit includes a NAND gate 55 the inputs to which are the output signals of FF01I, FF02B and FF03I of flip-flops 10, 20 and 30, respectively; a NAND gate 56 the inputs to which are signals FF01I and FF02; a NAND gate 57 the inputs to which are signals FF01B, FF02 and FF03I; and a NAND gate 58, to which the outputs of the NAND gate 55, NAND gate 56 and NAND gate 57 are applied as inputs, for outputting the NAND of these input signals as the signal JBTFLG.

The operation of this flag generating circuit will now be described. Consider the non-inverted outputs Q of the flip-flops 10, 20 and 30. When these are "000", "001", and "110", the outputs of respective ones of the NAND gates 55, 56 and 57 are logic "0" and the value of JBTFLG becomes logic "1". When the inverted outputs Q of the flip-flops 10, 20 and 30 are "100", "111", and "001" the value of JBTFLG becomes logic "0" (see the truth-value table shown in FIG. 4).

Figure 8:
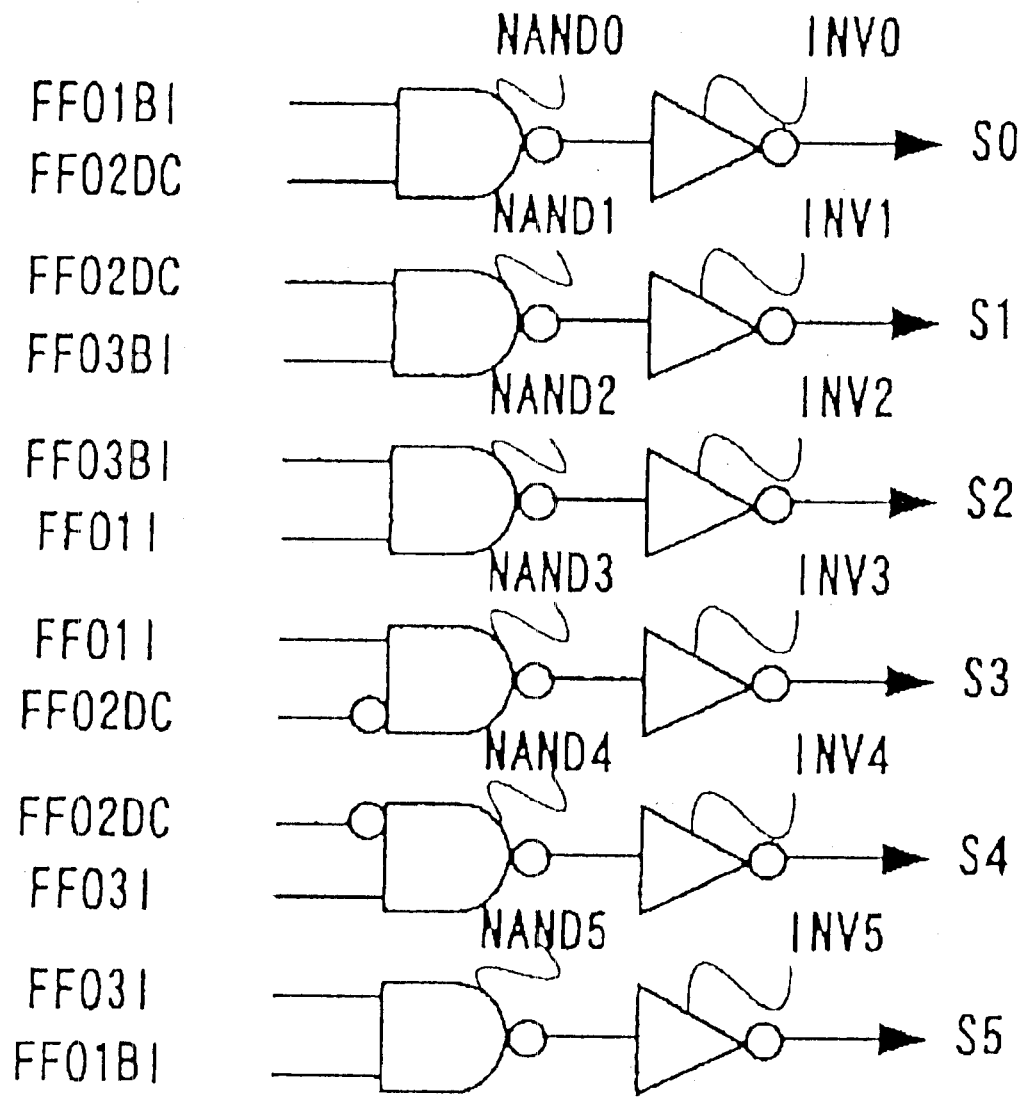
FIG. 8 is a diagram illustrating another example of the structure of a decoder circuit according to this embodiment.

FIG. 8 is a diagram illustrating the structure of the decoder circuit 160 the inputs to which are the output signal FF02DC of the rescue circuit 50 shown in FIG. 7a, the signals FF01I and FF03I obtained by inverting the signals from the non-inverting outputs Q of the flip-flops 10 and 30 constructing the ring counter 100, and the signals FF01BI, FF03BI obtained by inverting the signals from the inverting outputs QB of the flip-flops 10 and 30. As shown in FIG. 8, the structure of the decoder circuit differs from that shown in FIG. 5 in that the input terminals of the NAND gates 3 and 4, to which the signal FF02DC is applied, are inverting terminals (negative logic). Furthermore, as shown in FIG. 7a, the outputs of the flip-flops constructing the ring counter are inverted by inverters. As a consequence, the order of the signal connections of the input terminals of the decoder circuit shown in FIG. 8 differs from that shown in FIG. 5. The logic, however, is the same as that shown in FIG. 5.

S0=AND (FF01BI, FF02DC)
S1=AND (FF02DC, FF03BI)
S2=AND (FF03BI, FF01I)
S3=AND [FF01I, INVERTED (FF02C)]
S4=AND [INVERTED (FF02DC), FF03I]
S5=AND (FF03I, FF01BI)

FIG. 9 is a diagram illustrating an example of the structure of an interpolator control circuit 120 in FIG. 1. It is assumed that the interpolator 130 in FIG. 1 comprises a 6-step interpolator, and that the interpolator control circuit 120 supplies the interpolator 130 with a 6-bit signal as the control signal C (interior-division control signal).

As shown in FIG. 9, the interpolator control circuit 120 has a control signal generating circuit 1201; D-type flip-flops 1210 to 1215; and control logic circuits 1202 to 1207, which are provided so as to correspond to the D-type flip-flops 1210 to 1215, having their outputs O1 connected to the data input terminals D of respective ones of the D-type flip-flops 1210 to 1215. In FIG. 9, a logic circuit comprises a NOR gate 1221 and an inverter 1222, which constitute a basic cell, wherein the input terminal of the inverter 1222 is connected to the output terminal of the NOR gate 1221. The logic circuit functions as an OR gate.

The Q output terminals of the flip-flops 1210, 1211, 1212, 1213, 1214 and 1215 output six control signals C0 to C5 that control the interior-division ratio of the 6-step interpolator 130. The control signals C0 to C5, as well as control signals CB0 to CB5 obtained by inverting the control signals C0 to C5 by inverters (not shown), are supplied to the interpolator 130 as the control signal C and its complementary signal CB of FIG. 1.

The control signal generating circuit 1201, the inputs to which are phase-comparison result signals S_UP (UP in FIG. 1) and S_DN (DN in FIG. 1) from the phase comparator circuit 110, the signal JBTFLG provided by the flag generating circuit 150 and corresponding to the combination of selected clocks, and the signals C0 and C5, outputs control signals Right, Left and Hold, which indicate a right shift, left shift and hold, respectively. When the signal C5 is logic "0" and the signal C0 is logic "1", the interior-division ratio for the selected clock pair attains the lower limit or upper limit. The necessary reset operation is performed, therefore, in generation of the control signal C. In the control signal generating circuit 1201, control is performed such that the shift direction corresponding to the up signal (S_UP) is one direction when the flag signal JBTFLG is logic "1" and a different direction when the flag signal JBTFLG is logic "0". The same is true with regard to the down signal (S_DN).

The inputs to the control logic circuits 1202 to 1207 are the control signals Right, Left, Hold output from the control signal generating circuit 1201, an interior-division ratio control signal corresponding to the particular control logic circuit, and an interior-division ratio control signal on one side, or interior-division ratio control signals on both sides, of this interior-division ratio control signal. The control logic circuits 1202 to 1207 decode these signals, output the decoded results from their output terminals O1 and supply these results to the data input terminals D of the corresponding flip-flops.

Each of the control logic circuits. 1202 to 1207 has six input terminals I1 to I6 and one output terminal, and the circuits are identical in structure. For example, each includes three 2-input NAND gates whose inputs are connected to input terminals I1 and I2, input terminals I3 and I4 and input terminals I5 and I6, respectively, and a 3-input NAND gate the inputs to which are the outputs of the three 2-input NAND gates, and whose output is connected to the output terminal O1.

The control logic circuit 1202 at one end has the control signals Left, Hold, Right applied to its input terminals I1, I3 and I5, respectively, has the corresponding output signal C0 and its neighboring signal C1 applied to its input terminals I4 and I2, respectively, and has its input terminal I6 fixedly connected to ground potential.

The control logic circuit 1203 has the control signals Left, Hold, Right applied to its input terminals I1, I3 and I5, respectively, has the corresponding output signal (interior-division ratio control signal) C1 and its neighboring output signals C2 and C0 applied to its input terminals I4, I2 and I6, respectively, and has its output terminal O1 connected to the data input terminal D of the corresponding D-type flip-flop 1211.

The control logic circuits 1204, 1205 and 1206 have the control signals Left, Hold, Right applied to their input terminals I1, I3 and I5, respectively, have the output signal C2 and its neighboring output signal C3, C1, the output signal C3 and its neighboring signals C2 and C4, and the output signal C4 and its neighboring output signals C3 and C5 applied to their input terminals I4, I2, I6, respectively, and have their output terminals O1 connected to the data input terminals D of the corresponding D-type flip-flops 1212, 1213 and 1214.

The control logic circuit 1207 at the other end has the control signals Left, Hold, Right applied to its input terminals I1, I3, and I5, respectively, has the corresponding output signal C5 and the immediately preceding signal C4 applied to its input terminals I4 and I6, respectively, and has its input terminal I2 fixedly connected to the power-supply potential VDD. The output terminal O1 is connected to the data input terminal D of the corresponding D-type flip-flop 1215.

The output signal C0 is input to an OR gate, which comprises NOR gate 1221 and inverter 1222, together with the output of flip-flop 1211, and the inverter 1222 delivers the output signal C1.

The output signal C1 is input to an OR gate, which comprises NOR gate 1223 and inverter 1224, together with the output of flip-flop 1212, and the inverter 1224 delivers the output signal C2.

The output signal C2 is input to an OR gate, which comprises NOR gate 1225 and inverter 1226, together with the output of flip-flop 1213, and the inverter 1226 delivers the output signal C3.

The output signal C3 is input to an OR gate, which comprises NOR gate 1227 and inverter 1228, together with the output of flip-flop 1214, and the inverter 1228 delivers the output signal C4.

The output signal C4 is input to an OR gate, which comprises NOR gate 1229 and inverter 1230, together with the output of flip-flop 1215, and the inverter 1230 delivers the output signal C5.

The six bits C0 to C5 of the control signal for varying the interior-division ratio of the interpolator 130 comprise a combination of continuous "1"s and continuous "0"s and are generated by the shift register of flip-flops 1210 to 1215.

The basic operation of the circuit shown in FIG. 9 shifts the boundary between "0"s and "1"s of the control signal bits C0 to C5 in accordance with the up signal and down signal.

The control signals (interior-division ratio control signal) bits C0 to C5 comprise continuous "1"s and continuous "0"s. In addition to the arrangement for shifting the boundary between "1"s and "0"s, it is so arranged that the flip-flop of the highest stage that outputs logic "1" transmits this "1" to the flip-flops downstream. The control signal bits are generated by virtue of this arrangement. As shown in FIG. 9, when the output signal (interior-division ratio control signal) C0 is logic "1", the value of the signal C0 is transmitted to the output signal C1 via OR gates 1221 and 1222, to the output signal C2 via OR gates 1223 and 1224 and, in similar fashion, to the output signals C3, C4 and C5 via OR gates 1225 and 1226, OR gates 1227 and 1228 and OR gates 1229 and 1230. As a result of this arrangement, it is assured that when signal C0 becomes logic "1", the signals C1, C2, C3, C4 and C5 also will become logic "1".

The shift direction of the shift register changes depending upon the combination of clocks selected from the multiphase clocks, as mentioned above.

FIG. 10 is a diagram illustrating an example of patterns of the control signal C output from the interpolator control circuit 120 (see FIG. 1 and FIG. 9) in accordance with this embodiment of the present invention. As shown in FIG. 10, selection of a clock pair is performed by the clock selector 170 in a state in which the signal bits C0 to C5 for controlling interior-division are, e.g., "000000", and the control signal C is shifted to the left ("1" is transmitted to the left) in the interpolator control circuit 120 by the up signal, whereby "000001" is obtained. Thereafter, in similar fashion, when an up signal enters the interpolator control circuit 120, the control signal bits C0 to C5 output from the interpolator control circuit 120 change from "011111" to "111111".

If still a further up signal is input to the interpolator control circuit 120, the range of the interior-division ratio, i.e., the clock pairs in the clock selector 170, is changed over because the interior-division ratio in the interpolator control circuit 120 is at the lower or upper limit (extremal point). At this time the value of the flag JBTFLG also is changed over.

In this case, if a further up signal is input to the interpolator control circuit 120 in the range to which the changeover has been made, the interpolator control circuit 120 changes the control signal bits C0 to C5 from "111111" to "011111", "001111", ···, "000001", "000000". That is, the boundary between "0"s and "1"s in the control signal C is shifted to the right. The value of the flag JBTFLG at this time is made the complementary value of the flag JBTFLG that prevailed when the left-shift was made by the up signal. In the interpolator control circuit 120, the control signal C that is output resides at the extreme "000000". If an up signal enters, a further changeover is made in the range of the interior-division ratio, i.e., in the clocks.

Control for changing over the shift direction described with reference to FIG. 10 is carried out by the control signal generating circuit 1201 and control logic circuits 1202 to 1207 of the interpolator control circuit 120 (see FIG. 9).

Specifically, the shift direction (right shift and left shift) of the shift register (1210 to 1215) based upon the up signal (S_UP) and down signal (S_DN) is reversed by the value of the flag JBTFLG, and the control signal generating circuit 1201 outputs a signal, which controls the shift direction of the shift register, based upon the signals C0, C5, the flag JBTFLG, the up signal (S_UP) and the down signal (S_DN). Further, the control signal generating circuit 1201 places the hold signal (Hold) at logic "1" in a case where the up signal (S_UP) and down signal (S_DN) are both at logic "1".

The signal ENDFLG generated by the interpolator control circuit 120 indicates whether or not the control signal C is an extremal point (lower or upper limit of the interior-division ratio) and is supplied as an output enable signal (gate signal) to the up/down-signal control circuit 140 that generates the up and down signals applied to the ring counter 100. The up/down-signal control circuit 140 outputs the up and down signals to the ring counter 100 when ENDFLG is logic "1".

The OR gate comprising the NAND gate 1231 and inverter 1232 in interpolator control circuit 120 has the output signal C0 and the output signal C5 (inverted) applied thereto as inputs. The OR gate outputs the flag ENDFLG. When output signal C0 (least significant bit) is logic "1", the flag ENDFLG becomes logic "1". Further, when the output signal C5 (most significant bit) is logic "0", the flag ENDFLG becomes logic "1". In other words, when the output signal C0 is logic "1", the output signal bits C0 to C5 all become logic "1". Further, when the output signal bit C5 is logic "0", the output signal bits C1 to C5 all become logic "0". Either case corresponds to an extremal point (lower limit or upper limit) of the set value of interior-division ratio and, in either case, the flag ENDFLG becomes logic "1".

Figure 3:
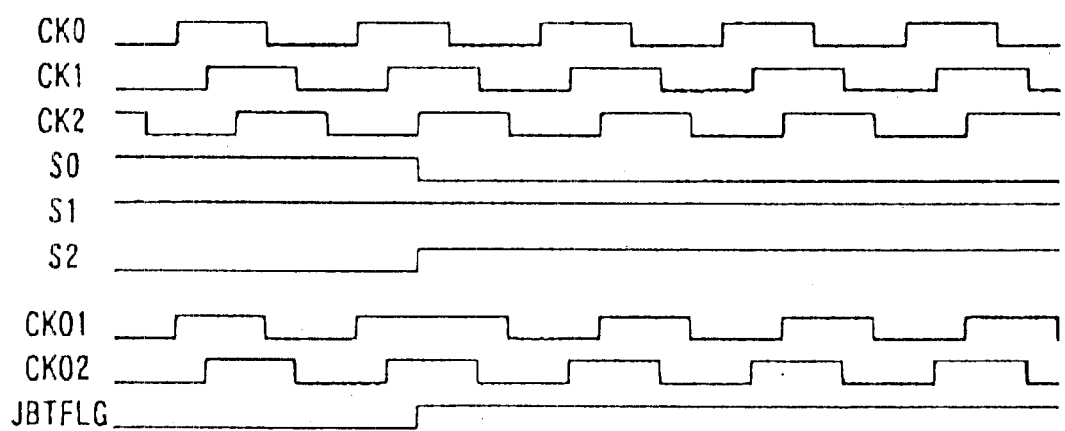
FIG. 3 is a diagram illustrating the timing operation of the clock control circuit according to this embodiment.

This will be explained with reference to the timing diagram of FIG. 3, by way of example. In a case where a clock pair CK0 and CK1 among the multiphase clocks is selected as the outputs CK01 and CK02 (the phase of CK01 leads) of clock selector 170 (see FIG. 1) (JBTFLG is logic "0") and then a clock pair CK2 and CK1 is selected by clock changeover, the phase of CK02 leads and JBTFLG is made logic "1".

If the control signal bits C0 to C5 supplied to the first switch group (for example, see transistors MN21 to MN25 in FIG. 13) connected to transistors (for example, see transistors MN22 to MN26 having the input signal IN1 of FIG. 13 input to the respective gates thereof) the input to which is the earlier rising signal (CK2) of the clock signals (CK2, CK3) input to the interpolator 130 of FIG. 1 as the input signals IN1, IN2 (see FIG. 13) start with "000000" and become "000001", "000011", "000111", ~"111111", then the delay time of the output signal of interpolator 130 becomes successively shorter as follows in accordance with $$T(n) = CV/(N \cdot I) - (n/N)T + T \qquad (4)$$
$$= T(N) + (N-n)/N \cdot T$$

T(6)+T

T(6)+(5/6)T,

T(6)+(4/6)T,

T(6)+(3/6)T,

T(6)+(2/6)T,

T(6 +(1/6)T,

T(6).

When the control signal bits C0 to C5 are "111111", this signifies an extremal point of the interior-division ratio of interpolator 130. In the interpolator control circuit 120, therefore, the flag ENDFLG is made logic "1", the up signal from the phase comparator circuit 110 is transmitted to the ring counter 100, decoding is performed by the decoder circuit 160 and changeover of the clock pair is carried out by the clock selector 170 so that clock signals (CK2, CK1) are selectively output.

In this case, the earlier rising input signal of the two signals input to the interpolator 140 is changed over (clock CK1 input as the input signal IN2 of FIG. 13) and the second switch group (see transistors MN27 to MN31 of FIG. 13) connected to the transistors (MN28 to MN32 having the input signal IN2 of FIG. 13 input to the respective gates thereof) to which this signal is input is controlled by the complementary signal CB of the interior-division ratio control signal C.

If a further up signal is input to the interpolator control circuit 120, the control signal bits C0 to C5 become "011111", the boundary between "0" and "1" is shifted to the right and the control signal bits CB0 to CB5, which are the complementary bits, become "100000". In response to further inputs of the up signal, the interior-division ratio control signal bits C0 to C5 become "001111"~"000001" and the CB bits become "110000"~"111110". The delay time of the output signal OUT of interpolator 130 from the positive-going transition of the input signal IN2 becomes successively shorter as follows:

T(6)+T

T(6)+(5/6)T,

T(6)+(4/6)T,

T(6)+(3/6)T,

T(6)+(2/6)T,

T(6)+(1/6)T,

T(6).

In a case where the output signal (interior-division ratio control signal) bits C0 to C5 are all logic "0" in the interpolator control circuit 120 shown in FIG. 9, the output of the control logic circuit 1207 becomes logic "1" when the control signal Left is logic "1" (when a shift to the left is made). This "1" logic is supplied to the data input terminal D of the flip-flop 1215. In response to receipt of the rising edge of the clock S_CLK, the output signal C5 becomes logic "1" after the delay time of the NOR gate 1229 and inverter 1230.

At the time of a shift to the left, the output of the control logic circuit 1206 to the terminal I2 of which the output signal C5 is input becomes logic "1", and this "1" logic is supplied to the data input terminal D of the flip-flop 1214. In response to receipt of the rising edge of the clock S_CLK, the output signal C4 becomes logic "1" after the delay time of the NOR gate 1227 and inverter 1280.

At the time of a shift to the left, the output of the control logic circuit 1205 to the terminal I2 of which the output signal C4 is input becomes logic "1", and this "1" logic is supplied to the data input terminal D of the flip-flop 1213. In response to receipt of the rising edge of the clock S_CLK, the output signal C3 becomes logic "1" after the delay time of the NOR gate 1225 and inverter 1226.

At the time of a shift to the left, the output of the control logic circuit 1204 to the terminal I2 of which the output signal C3 is input becomes logic "1", and this "1" logic.is supplied to the data input terminal D of the flip-flop 1212. In response to receipt of the rising edge of the clock S_CLK, the output signal C2 becomes logic "1" after the delay time of the NOR gate 1223 and inverter 1224.

At the time of a shift to the left, the output of the control logic circuit 1203 to the terminal I2 of which the output signal C2 is input becomes logic "1", and this "1" logic is supplied to the data input terminal D of the flip-flop 1211. In response to receipt of the rising edge of the clock S_CLK, the output signal C1 becomes logic "1" after the delay time of the NOR gate 1221 and inverter 1222.

At the time of a shift to the left, the output of the control logic circuit 1202 to the terminal I2 of which the output signal C1 is input becomes logic "1", and this "1" logic is supplied to the data input terminal D of the flip-flop 1210. In response to receipt of the rising edge of the clock S_CLK, the output signal C0 becomes logic "1". When the control signal C0 is logic "1", all of the output signals C1 to C5 are at logic "1".

When the control signal Right is at logic "1" (rightward shift) in a case where all of the output signals C1 to C5 are at logic "1", the output of the control logic circuit 1202 becomes logic "0" and this logic is supplied to the data input terminal D of the flip-flop 1210. In response to receipt of the rising edge of the clock S_CLK, the output signal C0 becomes logic "0".

At the time of a shift to the right (a case where the "0"/"1" boundary shifts to the right), the output of the control logic circuit 1203 to the terminal I6 of which the output signal C0 is input becomes logic "0", and this "0" logic is supplied to the data input terminal D of the flip-flop 1211. In response to receipt of the rising edge of the clock S_CLK, the output signal C1 becomes logic "0" after the delay time of the NOR gate 1221 and inverter 1222.

At the time of a shift to the right, the output of the control logic circuit 1204 to the terminal I6 of which the output signal C1 is input becomes logic "0", and this "0" logic is supplied to the data input terminal D of the flip-flop 1212. In response to receipt of the rising edge of the clock S_CLK, the output signal C2 becomes logic "0" after the delay time of the NOR gate 1223 and inverter 1224.

At the time of a shift to the right, the output of the control logic circuit 1205 to the terminal I6 of which the output signal C2 is input becomes logic "0", and this "0" logic is supplied to the data input terminal D of the flip-flop 1213. In response to receipt of the rising edge of the clock S_CLK, the output signal C3 becomes logic "0" after the delay time of the NOR gate 1225 and inverter 1226.

At the time of a shift to the right, the output of the control logic circuit 1206 to the terminal I6 of which the output signal C3 is input becomes logic "0", and this "0" logic is supplied to the data input terminal D of the flip-flop 1214. In response to receipt of the rising edge of the clock S_CLK, the output signal C4 becomes logic "0" after the delay time of the NOR gate 1227 and inverter 1228.

At the time of a shift to the right, the output of the control logic circuit 1207 to the terminal I6 of which the output signal C4 is input becomes logic "0", and this "0" logic is supplied to the data input terminal D of the flip-flop 1215. In response to receipt of the rising edge of the clock S_CLK, the output signal C5 becomes logic "0" after the delay time of the NOR gate 1229 and inverter 1230.

The circuits 1202 to 1207 having the outputs of respective ones of the flip-flops 1210 to 1215 input to their terminals I4 and having the hold signal Hold input to their terminals I3 deliver the outputs of flip-flops 1210 to 1215 when the hold signal Hold is logic "1".

Figure 11:
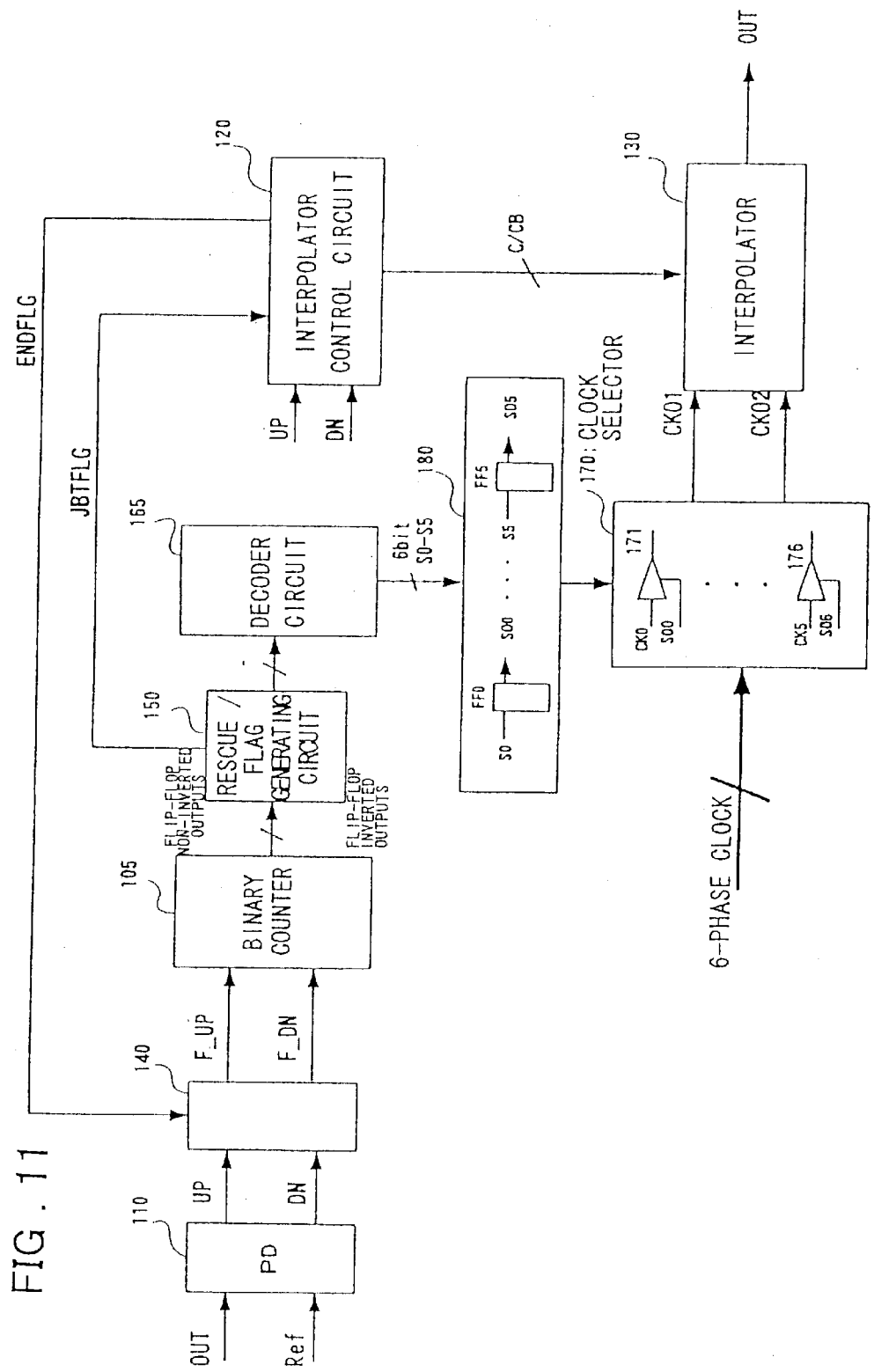
FIG. 11 is a block diagram illustrating the structure of a clock control circuit, which has a binary counter, for purposes of comparison.

FIG. 11 is a block diagram illustrating the structure of a clock control circuit, which has a binary counter 105 instead of a ring counter, for purposes of comparison. When the binary counter counts from 0 to 5, we have

"000",
"001",
"010",
"011",
"100",
"101", and hence there are cases where two bits change at the same. In a decoder circuit 165, therefore, in order to deal with noise that can be produced by delay or the like when two bits change simultaneously, outputs S0 to S5 of the decoder 165 are re-timed by a latch circuit 180 and supplied to a clock selector 170 as a selection signal.

By contrast, in the present invention, a latch circuit of the kind shown in FIG. 11 may be dispensed with because only one bit changes when the 6-bit signal input to the decoder circuit 160 changes.

Further, the decoder 165 in FIG. 11, which decodes the 3-bit output of the binary counter 105 and generates 6-bit data, involves circuitry of greater size than that using the ring counter.

It should be noted that the clock S_CLK supplied to the flip-flops 1210 to 1215 of the interpolator control circuit 120 (see FIG. 9) and the clock F_CLK supplied to the flip-flops of the ring counter (FIG. 6) may be generated from, e.g., the input clock (reference clock). The timing of the rising edge of the clock S_CLK supplied to the flip-flops 1210 to 1215 is set to such a timing that the timing of changeover of the output signals C0 to C5 will not overlap the transition timing of the clock signal input to the interpolator 130.

FIG. 15 is a diagram showing an example of a different structure for the interpolator 130 (see FIG. 1) used in the clock control circuit according the present invention. In FIG. 15, n-number of signals C0 to Cn−1 are interior-division ratio control signals supplied from the interpolator control circuit 120 (see FIG. 1) to the interpolator 130. Further, n-number of signals CB0 to CBn−1 are complementary signals of the interior-division ratio control signals C0 to Cn−1. (It should be noted that C0 to Cn−1 and CB0 to CBn−1 correspond to C and CB, respectively, in FIG. 1.)

As shown in FIG. 15, the interpolator includes:

n-number of P-channel MOS transistors $MP10_1$ to $MP10_n$, whose sources are connected in common to the high-potential power supply VDD, and to the gates of which a signal obtained by inverting the input signal IN2 from the second input terminal of the interpolator by an inverter INV102 is input in common;

n-number of P-channel MOS transistors $MP11_1$ to $MP11_n$, whose sources are respectively connected to the drains of the P-channel MOS transistors $MP10_1$ to $MP10_n$, whose drains are connected in common to an internal node (referred to also as a "common node") N101, and to the gates of which respective ones of the interior-division ratio control signals (complementary signals) CB0 to CBn−1 are input;

n-number of N-channel MOS transistors $MN11_1$ to $MN11_n$, whose drains are connected in common to the internal node N101 and to the gates of which respective ones of the interior-division ratio control signals (complementary signals) CB0 to CBn−1 are input; and n-number of N-channel MOS transistors $MN10_1$ to $MN10_n$, whose drains are connected to the sources of the N-channel MOS transistors $MN11_1$ to $MN11_n$ and to the gates of which is input a signal obtained by inverting the input signal IN1 from the first input terminal of the interpolator by an inverter INV101, and whose sources are connected commonly to the low-potential power supply VSS.

The interpolator further includes:

n-number of P-channel MOS transistors $MP20_1$ to $MP20_n$, whose sources are connected commonly to the high-potential power supply VDD and to the gates of which is input a signal obtained by inverting the input signal IN1 by an inverter INV101;

n-number of P-channel MOS transistors $MP21_1$ to $MP21_n$, whose sources are connected to the drains of the P-channel MOS transistors $MP20_1$ to $MP20_n$ and whose drains are connected to the internal node (common node) N101, and to the gates of which respective ones of the interior-division ratio control signals CB0 to CBn−1 are input;

n-number of N-channel MOS transistors $MN21_1$ to $MN21_n$, whose, drains are connected commonly to the internal node N101 and to the gates of which respective ones of the interior-division ratio control signals CB0 to CBn−1 are input; and n-number of N-channel MOS transistors $MN20_1$ to $MN20_n$, whose drains are connected to the sources of the N-channel MOS transistors $MN21_1$ to $MN21_n$ and to the gates of which is input a signal obtained by inverting the input signal IN2 by an inverter INV102, and whose sources are connected commonly to the low-potential power supply VSS.

The common node N101 is connected to the input terminal of a buffer 101 BUF101, the output terminal of the buffer BUF101 is connected to an output terminal VOUT, and the output terminal VOUT delivers the output signal of the interpolator.

A capacitor/switch C101, which comprises a parallel circuit composed of a capacitor and a switch, is provided between the input terminal (and therefore the common node N101) of the buffer BUF101 and the low-potential power supply VSS. As shown in FIG. 13, the capacitor/switch C101 is constructed by parallel-connecting series circuits (MN11 and CAP11, MN12 and CAP12, MN13 and CAP13, MN14 and CAP14, MN15 and CAP15) composed of switch elements, which comprise N-channel MOS transistors, and capacitors. The N-channel MOS transistors MN11 to MN15 are turned on and off by the logic values of period control signals connected to the gates of the N-channel MOS transistors MN11 to MN15, whereby the capacitance applied to the internal node N31 is decided. Of course, a fixed capacitance may be used as the capacitor/switch C101.

The operation of the interpolator shown in FIG. 15 will now be described. When the two input signals IN1 and IN2 applied to the interpolator make a transition from the high to the low level, the side of the N-channel MOS transistors operates as an interpolator. In order to simplify the description, it will be assumed below that the input signal IN2 makes its positive-going and negative-going transitions earlier than the input signal IN1. However, even if the input signal IN1 makes these transitions earlier, the same operation is achieved merely by interchanging the settings of the interior-division ratio control signals C0 to Cn−1 and CB0 to CBn−1.

If it is assumed that the number of signals that have been set to the high level among the interior-division ratio control signals C0 to Cn−1 is n−k (K−n), then, among the interior-division ratio control signals (complementary signals) CB0 to CBn−1, K-number attain the high level, Among the n-number of N-channel MOS transistors $MN21_1$ to $MN21_n$ having the interior-division ratio control signals C0 to Cn−1 connected to their respective gates, it is assumed that the gates of (n−K)-number of the MOS transistors attain the high level. Among the n-number of N-channel MOS transistors $MN11_1$ to $MN11_n$ having the interior-division ratio control signals CB0 to CBn−1 connected to their respective gates, it is assumed that the gates of K-number of the MOS transistors attain the high level. Let Tf represent the time difference between the falling edges of the input signals IN2 and IN1.

Among the interior-division ratio control signals C0 to Cn−1, the number that has been set to the high level is n−K. When the input signal IN2 falls from the high to the low level, therefore, (n−K)-number of the MOS transistors turn on among the n-number of N-channel MOS transistors $MN20_1$ to $MN20_n$ to the gates of which the inverted signal of input signal IN2 is input. If we let I represent the drain current of one of the N-channel MOS transistors at this time, then the charge accumulated in the capacitor (C101) connected to the common node N101 will discharge at a current value of (n−K)×I. Next, if the input signal IN1 falls from the high level to the low level following the time difference Tf, then, because K-number of the complementary signals CB0 to CBn−1 have been set to the high level, K-number of MOS transistors turn on among the N-channel MOS transistors $MN10_1$ to $MN10_n$ to the gates of which the inverted signal of input signal IN1 is input. The charge accumulated in the capacitor (C101) connected to the common node N101 discharges at a current value of K×I.

Let CV (where C is the capacitance value of the capacitor/switch C101) represent the electric charge, which is to be discharged, in order to invert the output of the buffer BUF101 having the potential at the common node N101 applied to its input terminal. When the input signal IN2 undergoes a transition from the high to the low level, the charge left in the capacitor (C101) when discharge has taken place over time Tf at current value I via (n−K)-number of transistors $MP20_1$ to $MP20_n$ is CV−(n−K)×I×Tf. Next, owing to discharge at the current K×I, the delay time (propagation delay time) from the transition of the input signal IN2 from the high to the low level to the inversion of the output signal of the output terminal OUT from the high to the low level is given by the following equation:

$$[CV-(n-K)\times I\times Tf]/(K\times I)$$

It should be noted that the buffer BUF101 is constituted by a single inverter (inverting circuit) in a case where the interpolator shown in FIG. 15 employs logic in which the output signal of the output terminal OUT rises at the falling edges of the input signals IN1 and IN2.

When the input signals IN1 and IN2 undergo a transition from a Ad low level to a high level, on the other hand, the side of the P-channel MOS transistors operates as an interpolator. Assume that among the complementary signals CB0 to CBn−1, K-number is at a high level and (n−K)-number is at a low level. As a result, (n−K)-number of the P-channel MOS transistors MP11$_1$ to MP11$_n$ are set to the ON state. It is assumed that (n−k)-number of the interior-division ratio control signals CB0 to CBn−1 is at a high level and that K-number is at a low level. As a result, K-number of the P-channel MOS transistors MP21$_1$ to MP21$_n$ are set to the ON state. Let Tr represent the time difference between the rising edges of the input signals IN2 and IN1.

When the input signal IN2 rises from a low level to a high level, (n−K)-number of the P-channel MOS transistors turn on among the P-channel MOS transistors MN10$_1$ to MN10$_n$ to the gates of which the inverted signal of input signal IN2 is input, and the electric charge of common node N101 is accumulated at a current (n−k)×I. If the input signal IN1 rises from the low level to the high level following the time (phase difference) Tr, then K-number of MOS transistors turn on among the P-channel MOS transistors MP20$_1$ to MP20$_n$ to the gates of which the inverted signal of input signal IN1 is input.

Let $CV_{TH}$ represent the electric charge for inverting the output of the buffer BUF110 having the potential at the common node N101 applied as its input. When the input signal IN2 undergoes a transition from the low to the high level, the charge that was accumulated over time Tr at current I via (n−K)-number of P-channel transistors MP20$_1$ to MP20$_n$ is (n−K)×I×Tr. Next, owing to charging at K×I, the delay time (propagation delay time) from the transition of the input signal IN2 from the low to the high level to the inversion of the output signal from the low to the high level is given by the following equation:

$$[CV_{TH}-(n-K) \times I \times Tr]/(K \times I)$$

The interpolator is so constructed that the side of the P-channel MOS transistors operates when the input signal makes a transition from the low to the high level and the side of the N-channel MOS transistors operates when the input signal makes a transition from the high to the low level. A feed-through current that flows from the power supply VDD to the side of ground (VSS) in the transition of the input signal is suppressed.

Thus, the interpolator shown in FIG. 15 outputs signals that undergo transitions at delay times, which are defined by times obtained by internally dividing phase differences (timing differences between transition edges), with regard to both rising and falling edges of respective ones of the input signals. In other words, the interpolator shown in FIG. 15 produces an output signal that rises at a delay time defined by a time obtained by internally dividing the time difference between rising edges of the input signals IN1 and IN2, and produces an output signal that falls at a delay time defined by a time obtained by internally dividing the time difference between falling edges of the input signals IN1 and IN2. It should be noted that in accordance with the logic of the application, an arrangement may be adopted in which the input signals IN1, IN2 are input to the gates of each of the transistors as is without being inverted by an inverter. In this case, the NMOS transistors will turn on at the rising edges of the input signals IN1 and IN2 and the PMOS transistors will turn on at the falling edges of the input signals IN1, IN2.

In the embodiment set forth above, an arrangement having the one interpolator 130 is described. However, depending upon the application, a plurality of the interpolators may be disposed in parallel, multiple pairs of clock signals may be selected by the clock selector 170 and these may be supplied to the plurality of interpolators. A plurality of interpolators may be arranged in the form of a tree to implement fine adjustment of phase. Further, an arrangement may be adopted in which the phase-comparison result signal output from the phase comparator circuit 110 is smoothed (time-averaged) by a filter circuit such as a digital filter and the smoothed signal is supplied to the interpolator control signal and up/down signal control circuit.

The clock control apparatus according to the present invention is ideal for use in a clock control circuit for generating a clock (internal clock), which is supplied to an internal circuit, in a semiconductor integrated circuit device. Furthermore, in accordance with the present invention, clock transition timing can be adjusted by an M-step interpolator at a resolution of less than a nanosecond (sub-nanosecond order of 100 or 10 picoseconds). The invention is ideal for use in a clock generating circuit that supplies the clock of a clock-data recovery circuit and electronic devices or in a clock generator of an LSI tester or the like.

Though the present invention has been described in accordance with the foregoing embodiments, the invention is not limited to these embodiments and it goes without saying that the invention covers various modifications and changes that would be obvious to those skilled in the art within the scope of the claims.

The meritorious effects of the present invention are summarized as follows.

Thus, in accordance with the present invention, a circuit arrangement for decoding the output of a ring counter and the inverted output thereof is adopted as a circuit that generates a signal for selecting a pair of clocks. As a result, the size of a clock control circuit is reduced. This arrangement is well suited to integrated circuits.

Further, in accordance with the present invention, by using a bit pattern that is the output of a ring counter and the signal obtained by inverting this output, only one bit changes when the output of the counter changes, it is no longer necessary to take measures for dealing with noise or the like, reliability is enhanced and the size of the circuitry is reduced. In accordance with the present invention, a phase adjustment operation can be performed reliably by providing a circuit that rescues patterns that are outside of expectations.

Further, in accordance with the present invention, the shift register of an interpolator control circuit that controls the interior-division ratio of an interpolator is implemented by a domino-type arrangement. This assures output of a prescribed signal pattern.

Further, the present invention is such that if the most significant bit of the output of an interpolator control circuit is logic "0", all bits are logic "0", and if the least significant bit is logic "0", all bits are logic "1", and the upper and lower limits of the interior-division ratio are discriminated based upon these signals. By virtue of such a simple arrangement, it is possible to generate a control signal for controlling clock changeover by gate control.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock control circuit comprising:

a ring counter, in which counting direction is changed over between up and down directions, for outputting, as the count value thereof, 2N(where N is a integer not less than 2)-number of bit patterns of N-bit signals and outputting N-bit inverted signals obtained by inverting each bit of the N-bit signals;

the decoder circuit, which receives a 2N-bit signals comprising the N-bit signal and the N-bit inverted signal output from said ring counter, for inverting one bit of the 2N-bit signals to thereby output a decoded signal in which at least two adjacent bits among the 2N bits take on a first value and the other bits take on a second value, the 2Nth bit and the first bit at the ends of the 2N-bit signals being adjacent;

a clock selector, which receives a plurality of clock signals of shifted phases and which receives the decoded signal output from said decoder circuit as a clock selection control signal, for outputting a pair of clock signals selected from the plurality of clock signals;

an interpolator, which receives from first and second input terminals, the pair of clock signals output from said clock selector, for outputting, from an output terminal, a clock signal having a delay time corresponding to a time obtained by internally dividing a phase difference between the pair of clock signals at an interior-division ratio set by an interior-division control signal provided thereto;

a phase comparator circuit for comparing the phase of the clock signal, output from said interpolator, and the phase of a reference clock; and an interpolator control circuit, which receives a phase-comparison result signal output from said phase comparator circuit, and which comprises a shift register, the shift direction of which is varied based upon the phase-comparison result signal and a forward/reverse relationship of the phases of the pair of clock signals input to the first and second input terminals of said interpolator, for supplying said interpolator with the interior-division control signal that sets the interior-division ratio of said interpolator.

2. A clock control circuit comprising:

a ring counter, in which counting direction is changed over based upon an up signal and a down-signal input thereto, for outputting, as the count value thereof, 2N(where N is a integer not less than 2)-number of bit patterns of N-bit signals and outputting N-bit inverted signals obtained by inverting each bit of the N-bit signals;

the rescue circuit, which receives a 2N-bit signals comprising the N-bit signal and the N-bit inverted signal output from said ring counter, for determining whether the 2N-bit signals are a bit pattern that is outside expectations and, when a bit pattern that is outside expectations is detected, for replacing the bit pattern with an allowed bit pattern;

a flag generating circuit for generating a flag signal that takes on a first logic value or a seconds logic value in dependence upon the bit pattern of the 2N-bit signals output from said ring counter;

a decoder circuit, which receives an output signal output from the rescue circuit, for outputting a decoded signal in which at least two adjacent bits among the 2N bits take on a first value and the other bits take on a second value, the 2Nth bit and the first bit at the ends of the 2N-bit signal being adjacent;

a clock selector, which receives a plurality of clock signals of equally spaced phase differences and which receives the decoded signal of 2N bits output from said decoder circuit as a clock selection control signal, for outputting a pair of clock signals selected from among the 2N-number of clock signals;

an interpolator, which receives from first and second input terminals, the pair of clock signals output from the clock selector, for outputting, from an output terminal, a clock signal having a delay time corresponding to a time obtained by internally dividing a phase difference between the pair of clock signals at an interior-division ratio set by an interior-division control signal input thereto;

a phase comparator circuit for receiving the clock signal output from said interpolator, and a reference clock and for comparing the phase of the clock signal and the phase of the reference clock; and an interpolator control circuit, which receives a phase-comparison result signal output from said phase comparator circuit and the flag signal output from said flag generating circuit, and which comprises a shift register, the shift direction of which is varied based upon values of these signals, for supplying said interpolator with the interior-division control signal that sets the interior-division ratio of said interpolator.

3. The clock control circuit as defined in claim 1, wherein said interpolator control circuit has a plurality of unit circuits each of which outputs the interior-division control signal, the output of one unit circuit among said plurality of unit circuits being transmitted as the output of another unit circuit.

4. The clock control circuit as defined in claim 1, wherein said interpolator control circuit has a plurality of unit circuits each of which outputs the interior-division control signal;

each of said plurality of unit circuits has a flip-flop and said plurality of flip-flops compose a shift register; and the output of one of said unit circuits is transmitted to the unit circuit of a succeeding stage, and the result of logical OR operation between the signal transmitted from said one unit circuit and an output of the flip-flop of said unit circuit of the succeeding stage is output as the output signal of said unit circuit of the succeeding stage.

5. The clock control circuit as defined in claim 1, wherein said interpolator control circuit has a circuit which, in a case where the interior-division ratio of said interpolator has reached an upper-limit value or a lower-limit value (termed as an "extremal point"), places a flag signal, which is indicative of an extremal point, in an active state and outputs the activated flag signal.

6. The clock control circuit as defined in claim 5, further comprising an up/down control circuit for generating up and down signals, which are supplied to said ring counter, based upon the phase-comparison result signal output from said phase comparator circuit when the flag signal output from said interpolator control circuit indicative of the extremal point is in an active state.

7. The clock control circuit as defined in claim 1, wherein said ring counter comprises:

flip-flops of N-number of stages; and

N-number of logic circuits, which correspond to respective ones of said N-number of flip-flops, for supplying input signals to respective ones of these flip-flops; wherein each of said logic circuits receives an up signal, a down signal and a hold signal specifying up, down and hold, respectively, and an output signal from each of the N-number of flip-flops; and control being performed in such a manner that:

in case of an up-count, a signal that is the inverse of the output of an Nth flip-flop is fed back and input to a first flip-flop via the logic circuit corresponding to this first flip-flop, the state of the output of the preceding flip-flop being transmitted to the input of the succeeding flip-flop via each logic circuit at the time of a shift operation by the clock;

in the case of a down-count, a signal that is the inverse of the output of the first flip-flop is fed back and input to the Nth flip-flop via the logic circuit corresponding to the Nth flip-flop, the state of the output of the succeeding flip-flop being transmitted to the input of the preceding flip-flop via each logic circuit at the time of a shift operation by the clock; and in the case of the hold state, the output signals of the flip-flops corresponding to.said logic circuits are supplied to the inputs of the flip-flops corresponding to these logic circuits.

8. The clock control circuit as defined in claim 1, wherein said decoder circuit comprises 2N-number of AND gates the inputs to which are an Ith bit and an (I+1)th bit (where I is 1 to 2N, and 2N+1 becomes 1 when I is 2N) of a signal, which has a bit width of 2N bits, comprising the N-bit signal and the signal obtained by inverting each bit of this N-bit signal.

9. The clock control circuit as defined in claim 1, wherein said interpolator control circuit includes:

flip-flops of a plurality (M) of stages;

a control signal generating circuit for generating left-shift, right-shift and hold signals based upon an up signal and a down signal constituting the phase-comparison result signal output from said phase comparator circuit and the value of the flag signal output from said flag generating circuit; and M-number of control logic circuits; wherein (M−2)-number of said control logic circuits exclusive of the first and Mth thereof at both ends have, as inputs thereto, the left-shift, right-shift and hold signals output from said control signal generating. circuit, an output signal, which corresponds to each control logic circuit, from among the M-bit output signals, and two output signals neighboring this output signal, for deciding, and supplying to a data input terminal of the corresponding flip-flop, an output logic value in accordance with the value of each output signal input thereto and the shift direction;

said first and M-th control logic circuits have, as inputs thereto, the left-shift, right-shift and hold signals output from said control signal generating circuit, output signals corresponding to respective ones of said control logic circuits at the ends, one output signal neighboring this output signal, and a fixed potential, for deciding, and supplying to a data input terminal of the corresponding flip-flop, an output logic value in accordance with these output signals and the shift direction;

an output of each flip-flop exclusive of the first flip-flop is provided with an OR gate;

each of said OR gates, which receives the output signal of the flip-flop preceding the corresponding flip-flop and the output signal of the corresponding flip-flop; and the output signal of the first flip-flop and the output signals of the OR gates corresponding to the flip-flops from the second onward are delivered as the interior-division control signal of M bits.

10. The clock control circuit as defined in claim 9, wherein said interpolator control circuit has a circuit for generating a flag signal, which indicates that the interior-division ratio of said interpolator has attained an upper-limit value or a lower-limit value (termed as an "extremal point"), based upon the value of the interior-division ratio control signal of the first and Mth bits among the interior-division ratio control signal of M bits.

11. The clock control circuit as defined in claim 1, wherein said interpolator includes:

a logic circuit for outputting the result of a prescribed logical operation between first and second input signals that are input from the first and second input terminals, respectively;

a first switch element, connected between a first power supply and an internal node, having a control terminal to which an output signal of said logic circuit is input;

a buffer circuit, which has an input terminal connected to the internal node, for inverting an output logic value if the size relationship between potential at the internal node and a threshold value reverses;

a plurality of series circuits connected in parallel between the internal node and a second power supply, each series circuit comprising a first constant-current source, a second switch element turned on and off by the first input signal, and a third switch element turned on and off by the interior-division control signal from said interpolator control circuit; and a plurality of series circuits connected in parallel between the internal node and the second power supply, each series circuit comprising a second constant-current source, a fourth switch element turned on and off by the second input signal, and a fifth switch element turned on and off by a complementary signal of the interior-division control signal from said interpolator control circuit.

12. The clock control circuit as defined in claim 11, wherein said first switch element in said interpolator comprises a transistor of a first conductivity type; and said second to fourth switch elements in said interpolator comprise transistors of a second conductivity type.

13. The clock control circuit as defined in claim 11, wherein at least a prescribed number (M) of each of said second, third, fourth, and fifth switch elements are provided in said interpolator; and wherein K-number (where K is 0 to M) of said third switch elements are turned on by the interior-division ratio control signal supplied to the group of said third switch elements;

(M−K)-number of said fifth switch elements are turned on by the complementary signal of the interior-division ratio control signal supplied to the group of said fifth switch elements; and said interpolator outputs a signal having a delay time corresponding to a phase that is the result of internally dividing a timing difference between the first and second input signals by the value of K, with 1/M of the timing difference being an incremental unit, the interior-division ratio being varied by varying the value of K.

14. The clock control circuit as defined in claim 11, wherein said interpolator includes:

a logic circuit, which receives first and second input signals from the first and second input terminals, respectively, for outputting result of a logical operation between these signals;

a first conductivity-type MOS transistor connected between a power supply and an internal node and having an output signal of said logic circuit applied thereto as a gate input; and a buffer circuit, which has an input terminal connected to the internal node, for inverting an output logic value if the size relationship between potential at the internal node and a threshold value reverses;

a plurality of series circuits connected in parallel between the internal node and ground, each series circuit comprising a second conductivity-type MOS transistor, which has the first input signal applied thereto as a gate input and is driven by a constant-current source, and a switch element turned on an off by the interior-division control signal from said interpolator control circuit;

a plurality of series circuits connected in parallel between the internal node and ground and each series circuit comprising a second conductivity-type MOS transistor, which has the second input signal applied thereto as a gate input and is driven by a constant-current source, and a switch element turned on an off by the interior-division control signal from said interpolator control circuit; and a plurality of series circuits connected in parallel between the internal node and ground and each series circuit comprising a switch element and a capacitor, said switch element being turned on and off by a period control signal connected to a control terminal of said switch element, whereby a value of capacitance applied to the internal node is varied.

15. The clock control circuit as defined in claim 1, wherein said interpolator includes:

a first switch element group and a second switch element group stacked one above the other between a high-potential power supply and an internal node, wherein said first switch element group, which is composed of parallel-connected switch elements, has the input signal from the first input terminal or a signal that is the inverse of this input signal input commonly to control terminals thereof and said second switch element group, which is composed of parallel-connected switch elements, has the interior-division ratio control signals input to respective ones of the control terminals thereof;

a third switch element group and a fourth switch element group stacked one above the other between the internal node and a low-potential power supply, wherein said third switch element group, which is composed of parallel-connected switch elements, has the interior-division ratio control signals input to respective ones of the control terminals thereof and said fourth switch element group, which is composed of parallel-connected switch elements, has the input signal from the second; input terminal or a signal that is the inverse of this input signal input commonly to control terminals thereof;

a fifth switch element group and a sixth switch element group stacked one above the other between the high-potential power supply and the internal node, wherein said fifth switch element group, which is composed of parallel-connected switch elements, has the input signal from the second input terminal or a signal that is the inverse of this input signal input commonly to control terminals thereof and said sixth switch element group, which is composed of parallel-connected switch elements, has complementary signals of the interior-division ratio control signal inputs to respective ones of the control terminals thereof; and a seventh switch element group and an eighth switch element group stacked one above the other between the internal node and the low-potential power supply, wherein said seventh switch element group, which is composed of parallel-connected switch elements, has complementary signals of the interior-division ratio control signals input to respective ones of the control terminals thereof and said eighth switch element group, which is composed of parallel-connected switch elements, has the input signal from the first input terminal or a signal that is the inverse of this input signal input commonly to control terminals thereof;

a capacitor connected between the internal node and the low-potential power supply; and a buffer circuit having an input terminal, connected to the internal node, for inverting an output logic value if the size relationship between the potential at the internal node and a threshold value reverses.

16. The clock control circuit as defined in claim 1, wherein said interpolator includes at least:

N-number (where N is an integer and not less than 2) of P-channel MOS transistors (referred to as a "first group of P-channel MOS transistors"), having sources connected commonly to the high-potential power supply VDD and gates to which a first input signal that enters from the first input terminal is supplied commonly;

N-number of P-channel MOS transistors (referred to as a "second group of P-channel MOS transistors"), having sources connected to drains of respective ones of the P-channel MOS transistors of the first group, gates to which respective ones of the interior-division ratio control signals are supplied, and drains connected commonly to an internal node;

N-number of N-channel MOS transistors (referred to as a "first group of N-channel MOS transistors"), having drains connected commonly to the internal node and gates to which respective ones of the interior-division ratio control signals are supplied;

N-number of N-channel MOS transistors (referred to as a "second group of N-channel MOS transistors"), having drains connected to sources of respective ones of the N-channel MOS transistors of the first group and gates to which a second input signal that enters from the second input terminal is supplied commonly;

N-number of P-channel MOS transistors (referred to as a "third group of P-channel MOS transistors"), having sources connected commonly to the high-potential power supply and gates to which the second input signal is supplied commonly;

N-number of P-channel MOS transistors (referred to as a "fourth group of P-channel MOS transistors"), having sources connected to drains of respective ones of the P-channel MOS transistors of the third group, gates to which respective ones of complementary signals of the interior-division ratio control signals are supplied, and drains connected commonly to an internal node;

N-number of N-channel MOS transistors (referred to as a "third group of N-channel MOS transistors"), having drains connected commonly to the internal node and gates to which respective ones of the complementary signals of the interior-division ratio control signals are supplied; and N-number of N-channel MOS transistors (referred to as a "fourth group of N-channel MOS transistors"), having drains connected to sources of respective ones of the N-channel MOS transistors of the third group and gates to which the first input signal is supplied commonly;

a capacitor connected to the internal node is charged via the P-channel MOS transistors of the first to fourth groups and is discharged via the N-channel MOS transistor of the first to fourth groups; and a non-inverting or inverting buffer circuit is provided and has an input terminal connected to the internal node;

said buffer circuit having an output terminal that delivers an output signal from said interpolator.

17. The clock control circuit as defined in claim 15, wherein a capacitor/switch circuit, which comprises a plurality of parallel-connected series circuits each composed of a switch element and a capacitor, is provided between the internal node and the low-potential power supply, and the switch elements of said capacitor/switch circuit are turned on and off by a period control signal connected to control terminals of the switch elements, whereby a value of capacitance applied to the internal node is varied.

18. The clock control circuit as defined in claim 16, further comprising first and second inverters for inverting the first and second input signals that enter from the first and second input terminals, respectively;

wherein said first inverter has an output terminal connected commonly to the gates of the P-channel MOS transistors of the first group and to the gates of the N-channel MOS transistors of the fourth group; and the second inverter has an output terminal connected commonly to the gates of the P-channel MOS transistors of the third group and to the gates of the N-channel MOS transistors of the second group.

19. The clock control circuit as defined in claim 1, further comprising the rescue circuit, which receives a 2N-bit signals comprising the N-bit signal and the N-bit inverted signals output from said ring counter, for determining whether the 2N-bit signals are a bit pattern that is outside expectations and, when a bit pattern that is outside expectations is detected, for replacing the bit pattern with an allowed bit pattern, 2N-bit signals output from the rescue circuit being fed to the decoder circuit.

20. The clock control circuit as defined in claim 1, further comprising a flag generating circuit for generating a flag signal that takes on a first logic value or a second logic value in dependence upon the bit pattern of the 2N-bit signals output from said ring counter, the interpolator control circuit, receiving a phase-comparison result signal output from said phase comparator circuit and the flag signal output from said flag generating circuit, changing over the shift direction of the shift register based upon values of these signals, for supplying said interpolator with the interior-division control signal that sets the interior-division ratio of said interpolator.

21. The clock control circuit as defined in claim 1, wherein the counting direction of said ring counter is changed over between up and down directions based on the a phase-comparison result signal output from said phase comparator circuit.

22. A clock control circuit comprising:

a ring counter circuit, outputting 2N-bit(where N is a integer not less than 2) width signals made up of N-bit signals which is the count value thereof, and N-bit inverted signals, each bit of which is complementary signal of each bit of the N-bit signals of the count value;

the decoder circuit, which receives a 2N-bit width signals output from said ring counter, for inverting one bit of the 2N-bit signals to thereby output a decoded signal in which at least two adjacent bits among the 2N bits take on a first value and the other bits take on a second value, the 2Nth bit and the first bit at the ends of the 2N-bit signals being adjacent;

a clock selector, which receives a plurality of clock signals of shifted phases and which receives the decoded signal output from said decoder circuit as a clock selection control signal, for outputting a pair of clock signals selected from the plurality of clock signals;

an interpolator, which receives from first and second input terminals the pair of clock signals output from said clock selector, for outputting a clock signal having a delay time corresponding to a time obtained by internally dividing a phase difference between the pair of clock signals at an interior-division ratio set by an interior-division control signal provided thereto;

a phase comparator circuit for comparing the phase of the clock signal, output from said interpolator, and the phase of a reference clock; and an interpolator control circuit, which receives a phase-comparison result signal output from said phase comparator circuit, and for supplying said interpolator with the interior-division control signal that sets the interior-division ratio of said interpolator, counting direction of said ring counter being changed over between up and down directions based on the phase-comparison result signal output from said phase comparator circuit.

* * * * *